(12) United States Patent
Asada

(10) Patent No.: US 10,340,873 B2
(45) Date of Patent: Jul. 2, 2019

(54) BAND PASS FILTER AND LAMINATE BAND PASS FILTER

(71) Applicant: Murata Manufacturing Co., Ltd., Nagaokakyo-shi, Kyoto-fu (JP)

(72) Inventor: Satoshi Asada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/709,808

(22) Filed: Sep. 20, 2017

(65) Prior Publication Data

US 2018/0013395 A1    Jan. 11, 2018

Related U.S. Application Data

(63) Continuation of application No. PCT/JP2016/051337, filed on Jan. 18, 2016.

(30) Foreign Application Priority Data

Mar. 23, 2015    (JP) .................................. 2015-060087

(51) Int. Cl.
*H03H 7/09*     (2006.01)
*H03H 7/01*     (2006.01)
*H03H 7/075*    (2006.01)
*H01F 17/00*    (2006.01)
*H03H 1/00*     (2006.01)

(52) U.S. Cl.
CPC ........... *H03H 7/09* (2013.01); *H01F 17/0013* (2013.01); *H03H 7/0115* (2013.01); *H03H 7/0161* (2013.01); *H03H 7/075* (2013.01); *H03H 7/1775* (2013.01); *H01F 2017/0026* (2013.01); *H03H 2001/0085* (2013.01)

(58) Field of Classification Search
CPC ......... H03H 2001/0085; H03H 7/0115; H03H 7/0161; H03H 7/09
USPC .................................................. 333/175, 185
See application file for complete search history.

(56) References Cited

U.S. PATENT DOCUMENTS

| | | | | |
|---|---|---|---|---|
| 5,168,251 A | * | 12/1992 | Zennamo, Jr. | ....... H03H 7/0115 333/12 |
| 8,125,299 B2 | * | 2/2012 | Alkan | ...................... H03H 1/00 333/175 |
| 2010/0007437 A1 | | 1/2010 | Taniguchi | |
| 2010/0171568 A1 | | 7/2010 | Taniguchi | |

(Continued)

FOREIGN PATENT DOCUMENTS

| | | |
|---|---|---|
| JP | 61-162127 U | 10/1986 |
| JP | 2003-045723 A | 2/2003 |

(Continued)

OTHER PUBLICATIONS

Official Communication issued in International Patent Application No. PCT/JP2016/051337, dated Apr. 5, 2016.

*Primary Examiner* — Rakesh B Patel
(74) *Attorney, Agent, or Firm* — Keating & Bennett, LLP

(57) ABSTRACT

A band pass filter includes parallel resonators. An inductor of a first parallel resonator at an intermediate stage is divided into a first inductor and a second inductor connected in parallel with each other. The first inductor and an inductor of a second parallel resonator are in magnetic coupling with each other, and the second inductor and an inductor of a third parallel resonator are in magnetic coupling with each other.

16 Claims, 11 Drawing Sheets

400

(56) References Cited

U.S. PATENT DOCUMENTS

| | | |
|---|---|---|
| 2013/0241672 A1 | 9/2013 | Tamaru et al. |
| 2015/0002240 A1* | 1/2015 | Reiha .................. H03H 7/0161 333/132 |

FOREIGN PATENT DOCUMENTS

| | | |
|---|---|---|
| JP | 2010-021321 A | 1/2010 |
| WO | 2009/041294 A1 | 4/2009 |
| WO | 2012/066873 A1 | 5/2012 |

\* cited by examiner

FREQUENCY [0.2GHz to 12.5GHz]

FREQUENCY [0.2GHz to 12.5GHz]

BAND PASS FILTER AND LAMINATE BAND PASS FILTER

CROSS REFERENCE TO RELATED APPLICATIONS

This application claims the benefit of priority to Japanese Patent Application No. 2015-060087 filed on Mar. 23, 2015 and is a Continuation Application of PCT Application No. PCT/JP2016/051337 filed on Jan. 18, 2016. The entire contents of each application are hereby incorporated herein by reference.

BACKGROUND OF THE INVENTION

1. Field of the Invention

The present invention relates to a band pass filter. More particularly, the present invention relates to a band pass filter in which magnetic coupling between inductors of adjacent LC parallel resonators is easily adjusted.

Furthermore, the present invention relates to a laminate band pass filter in which the above-described band pass filter includes a multilayer body in which insulating layers are laminated one on top of another. More particularly, the present invention relates to a laminate band pass filter in which magnetic coupling between the inductors of the adjacent LC parallel resonators is easily adjusted.

2. Description of the Related Art

International Publication No. WO2009/041294A1 discloses a band pass filter which includes a plurality of LC parallel resonators and in which inductors of the adjacent LC parallel resonators are magnetically coupled.

FIGS. 11 and 12 illustrate a band pass filter 500 disclosed in International Publication No. WO2009/041294A1. FIG. 11 is an exploded perspective view of the band pass filter 500. FIG. 12 is an equivalent circuit diagram of the band pass filter 500.

As illustrated in FIG. 11, the band pass filter 500 includes a multilayer body 107 in which six insulating layers (dielectric layers) 101 to 106 are sequentially laminated from the bottom. The following electrodes are provided on the multilayer body 107.

A ground electrode 109 is provided on the insulating layer 101. The ground electrode 109 is connected to ground terminals 151 and 152 that extend to side surfaces of the multilayer body 107.

Capacitor electrodes 111, 112, and 113 are provided on the insulating layer 102.

Input/output terminals (input/output electrodes) 121 and 122 and a capacitor electrode (capacitor between input and output) 160 are provided on the insulating layer 103.

An S-shaped line electrode 117 is provided on the insulating layer 104.

C-shaped line electrodes 116 and 118 are provided on the insulating layer 105. The line electrode 116 and the line electrode 118 are line symmetrically (also, point symmetrically) arranged.

No electrode is provided on the insulating layer 106.

Via electrodes 131 and 135 are that penetrates through the insulating layers 103 to 105. The via electrode 131 has one end connected to the capacitor electrode 111 and the other end connected to one end 116A of the line electrode 116 and is connected to the first input/output terminal 121 through an extended electrode 121A between the one and the other ends thereof. The via electrode 135 has one end connected to the capacitor electrode 113 and the other end connected to one end 118A of the line electrode 118 and is connected to the second input/output terminal 122 through an extended electrode 122A between the one and the other ends thereof.

Via electrodes 132 and 136 are that penetrates through the insulating layers 102 to 105. The via electrode 132 has one end connected to the ground electrode 109 and the other end connected to the other end 116B of the line electrode 116. The via electrode 136 has one end connected to the ground electrode 109 and the other end connected to the other end 118B of the line electrode 118.

A via electrode 133 is that penetrates through the insulating layers 102 to 104. The via electrode 133 has one end connected to the ground electrode 109 and the other end connected to one end 117A of the line electrode 117.

A via electrode 134 is that penetrates through the insulating layers 103 and 104. The via electrode 134 has one end connected to the capacitor electrode 112 and the other end connected to the other end 117B of the line electrode 117.

The band pass filter 500 disclosed in International Publication No. WO2009/041294A1 has the equivalent circuit illustrated in FIG. 12.

The band pass filter 500 includes an LC parallel resonator at a first stage (input stage) that includes an inductor L1 and a capacitor C1, an LC parallel resonator at a second stage (intermediate stage) that includes an inductor L2 and a capacitor C2, and an LC parallel resonator at a third stage (output stage) that includes an inductor L3 and a capacitor C3.

One end of the LC parallel resonator at the first stage, a capacitor C12, one end of the LC parallel resonator at the second stage, a capacitor C23, one end of the LC parallel resonator at the third stage are sequentially connected between a first input/output terminal (IN) and a second input/output terminal (OUT).

The other end of the LC parallel resonator at the first stage, the other end of the LC parallel resonator at the second stage, and the other end of the LC parallel resonator at the third stage are connected to a ground terminal.

A capacitor C13 is connected in parallel with the capacitor C12 and the capacitor C23 that are connected in series.

Three LC parallel resonators are in capacitive coupling with one another by using the capacitors C12, C13, and C23. Furthermore, the inductor L1 of the first LC parallel resonator and the inductor L2 of the second LC parallel resonator are in magnetic coupling M1 with each other, and the inductor L2 of the second LC parallel resonator and the inductor L3 of the third LC parallel resonator are in magnetic coupling M2 with each other.

Next, referring to FIGS. 11 and 12, the relationship between the structure of the band pass filter 500 and the equivalent circuit of the band pass filter 500 is described.

The inductor L1 of the LC parallel resonator at the first stage is defined by a path that connects the extended electrode 121A, the via electrode 131, the one end 116A of the line electrode 116, a main body portion of the line electrode 116, the other end 116B of the line electrode 116, the via electrode 132, and the ground electrode 109.

The capacitor C1 of the LC parallel resonator at the first stage is defined by capacitance generated between the capacitor electrode 111 and the ground electrode 109. The first input/output terminal 121 and the capacitor C1 are connected to each other through the extended electrode 121A and the via electrode 131.

The inductor L2 of the LC parallel resonator at the second stage is defined by a path that connects the capacitor electrode 112, the via electrode 134, the other end 117B of the line electrode 117, a main body portion of the line electrode 117, the one end 117A of the line electrode 117, the via electrode 133, and the ground electrode 109.

The capacitor C2 of the LC parallel resonator at the second stage is defined by capacitance generated between the capacitor electrode 112 and the ground electrode 109.

The inductor L3 of the LC parallel resonator at the third stage is defined by a path that connects the extended electrode 122A, the via electrode 135, the one end 118A of the line electrode 118, a main body portion of the line electrode 118, the other end 118B of the line electrode 118, the via electrode 136, and the ground electrode 109.

The capacitor C3 of the LC parallel resonator at the third stage is defined by capacitance generated between the capacitor electrode 113 and the ground electrode 109. The second input/output terminal 122 and the capacitor C3 are connected to each other through the extended electrode 122A and the via electrode 135.

The capacitor C12 is defined by capacitance generated between the capacitor electrodes 111 and 112.

The capacitor C23 is defined by capacitance generated between the capacitor electrodes 112 and 113.

The capacitor C13 is defined by resultant capacitance of capacitance generated between capacitor electrode 111 and the capacitor electrode 113, capacitance generated between the capacitor electrode 160 between the input and output and the extended electrodes 121A and 122A, and capacitance generated between both end portions of the capacitor electrode 160 between the input and output and the capacitor electrodes 111 and 113.

FIG. 13 illustrates the positional relationship between the line electrode 116 and the line electrode 117 and the positional relationship between the line electrode 117 and the line electrodes 118 in the band pass filter 500. Also, the direction of a current of the inductor L1 flowing through the line electrode 116 is indicated by an arrow $A_{L1}$, the direction of a current of the inductor L2 flowing through the line electrode 117 is indicated by an arrow $A_{L2}$, and the direction of a current of the inductor L3 flowing through the line electrode 118 is indicated by an arrow $A_{L3}$. Furthermore, the magnetic coupling between the inductor L1 and the inductor L2 is indicated by M1, and the magnetic coupling between the inductor L1 and the inductor L2 is indicated by M2.

The line electrode 116 and the line electrode 117 are superposed on each other and the line electrode 117 and the line electrode 118 are superposed on each other in the band pass filter 500.

However, since the line electrode 117 has an S-shape, the line electrode 116 and the line electrode 117 are not superposed on each other in part of the band pass filter 500. Likewise, the line electrode 117 and the line electrode 118 are not superposed on each other in part of the band pass filter 500.

Since there exists the part where the line electrode 116 and the line electrode 117 are not superposed on each other, the magnetic coupling M1 between the inductor L1 and the inductor L2 decreases. Likewise, since there exists the part where the line electrode 117 and the line electrode 118 are not superposed on each other, the magnetic coupling M2 between the inductor L2 and the inductor L3 decreases.

Furthermore, in the band pass filter 500, there is a significant problem in that the strength of the magnetic coupling M1 between the inductor L1 and the inductor L2 and the strength of the magnetic coupling M2 between the inductor L2 and the inductor L3 are slightly different from each other instead of being completely matched to each other.

The cause of this is that the positional relationship between the line electrode 116 and the line electrode 117 is not the same as the positional relationship between the line electrode 117 and the line electrode 118 in the multilayer body 107. That is, as illustrated FIG. 13, the line electrode 116 and the line electrode 117 are superposed such that a flow start part of the current $A_{L1}$ in the line electrode 116 and a flow end part of the current $A_{L2}$ in the line electrode 117 are superposed on each other. In contrast, the line electrode 117 and the line electrode 118 are superposed such that a flow end part of the current $A_{L2}$ in the line electrode 117 and a flow start part of the current $A_{L1}$ in the line electrode 118 are superposed on each other.

Since the positional relationship between the line electrode 116 and the line electrode 117 and the positional relationship between the line electrode 117 and the line electrode 118 are not the same, the strength of the magnetic coupling M1 between the inductor L1 and the inductor L2 and the strength of the magnetic coupling M2 between the inductor L2 and the inductor L3 are not equalized.

Furthermore, since the strength of the magnetic coupling M1 and the strength of the magnetic coupling M2 are not equalized, the reflection characteristic varies between one and the other input/output terminal sides in the band pass filter 500. Furthermore, in the band pass filter 500, impedance is not matched between the one and the other input/output terminal sides.

Furthermore, in a design stage of the band pass filter, in order to adjust magnetic coupling between inductors of LC parallel resonators, for example, the lengths of line electrodes are varied from an LC parallel resonator to another LC parallel resonator. Thus, the adjustment of the magnetic coupling is not an easy task. In more detail, changing the length of one of the line electrodes affects the filter characteristic of the band pass filter. Thus, even when magnetic coupling between the inductors of the LC parallel resonators can be adjusted, another problem such as the filter characteristic of the band pass filter deviating from a desired range may arise.

SUMMARY OF THE INVENTION

Preferred embodiments of the present invention provide band pass filters in which magnetic coupling between inductors of LC parallel resonators is easily adjusted, and laminate band pass filters in which the magnetic coupling of the inductors of the LC parallel resonators included in the band pass filter is easily adjusted.

A band pass filter according to a preferred embodiment of the present invention includes a first input/output terminal, a second input/output terminal, a ground terminal, and a plurality of LC parallel resonators. An inductor and a capacitor are connected in parallel with each other in each of the plurality of LC parallel resonators. The plurality of LC parallel resonators include an LC parallel resonator at a first input/output stage, at least one LC parallel resonator at an intermediate stage, and an LC parallel resonator at a second input/output stage. One end of the LC parallel resonator at the first input/output stage, one end of the LC parallel resonator at the intermediate stage, and one end of the LC parallel resonator at the second input/output stage are sequentially connected between the first input/output terminal and the second input/output terminal. Another end of the LC parallel resonator at the first input/output stage, another end of the LC parallel resonator at the intermediate stage, and another end of the LC parallel resonator at the second input/output stage are connected to the ground terminal. The inductors of the adjacent LC parallel resonators are magnetically coupled to one another. The inductor of the at least one LC parallel resonator at the intermediate stage is divided into a first inductor and a second inductor connected in parallel with each other. The first inductor is magnetically coupled to the inductor of one of the adjacent LC parallel resonators, and the second inductor is magnetically coupled to the inductor of another adjacent LC parallel resonator.

A ratio of an inductance value of the first inductor to an inductance value of the second inductor may be, for example, 1:1. In this case, the strength of the magnetic coupling between the first inductor and the inductor of the one of the adjacent LC parallel resonators and the strength of the magnetic coupling between the second inductor and the inductor of the other adjacent LC parallel resonator are able to be easily equalized. Here, equalizing the strengths of the magnetic couplings indicates that both the strengths of the magnetic couplings are equalized or substantially equalized with slight variation caused by errors in the manufacture or the like of the band pass filter excluded.

Furthermore, the band pass filter may be configured such that the LC parallel resonators are provided in three units in which the at least one LC parallel resonator at the intermediate stage includes a single LC parallel resonator and the inductor of the single LC parallel resonator at the intermediate stage is divided into the first inductor and the second inductor connected in parallel with each other. In this case, the strength of the magnetic coupling between the inductor of the LC parallel resonator at the first input/output stage and the first inductor of the LC parallel resonator at the intermediate stage and the strength of the magnetic coupling between the second inductor of the LC parallel resonator at the intermediate stage and the inductor of the LC parallel resonator at the second input/output stage are able to be easily adjusted.

Furthermore, the band pass filter may be configured such that the LC parallel resonators are provided in four units in which the at least one LC parallel resonator at the intermediate stage includes two LC parallel resonators and the inductors of the two LC parallel resonators at the intermediate stage are each divided into the first inductor and the second inductor connected in parallel with each other. In this case, the strengths of the following magnetic couplings are able to be easily adjusted: the magnetic coupling between the inductor of the LC parallel resonator at the first input/output stage and the first inductor of one of the LC parallel resonator at the intermediate stage; the magnetic coupling between the second inductor of the one of the LC parallel resonators at the intermediate stage and the first inductor of the other LC parallel resonator at the intermediate stage; and the magnetic coupling between the second inductor of the other LC parallel resonator at the intermediate stage and the inductor of the LC parallel resonator at the second input/output stage.

Furthermore, the band pass filter may be configured such that the LC parallel resonators are disposed in five units in which the at least one LC parallel resonator at the intermediate stage includes three LC parallel resonators, and the inductor of one of the three LC parallel resonators disposed at a middle position of the intermediate stage is divided into the first inductor and the second inductor connected in parallel with each other. In this case, the strength of the magnetic coupling between the inductor of the LC parallel resonator on the first input/output stage side of the intermediate stage and the first inductor of the LC parallel resonator at the middle position of the intermediate stage and the strength of the magnetic coupling between the second inductor of the LC parallel resonator at the middle position of the intermediate stage and the inductor of the LC parallel resonator on the second input/output stage side of the intermediate stage are able to be easily adjusted.

Furthermore, the band pass filter may be configured such that the LC parallel resonators are disposed in five units in which the at least one LC parallel resonator at the intermediate stage includes three LC parallel resonators, and the inductors of the three LC parallel resonators at the intermediate stage are each divided into the first inductor and the second inductor connected in parallel with each other. In this case, the strengths of the following magnetic couplings are able to be easily adjusted: the magnetic coupling between the inductor of the LC parallel resonator at the first input/output stage and the first inductor of the LC parallel resonator on the first input/output stage side of the intermediate stage; the magnetic coupling between the second inductor of the LC parallel resonator on the first input/output stage side of the intermediate stage and the first inductor of the LC parallel resonator at the middle position of the intermediate stage; the magnetic coupling between the second inductor of the LC parallel resonator at the middle position of the intermediate stage and the first inductor of the LC parallel resonator on the second input/output stage side of the intermediate stage; and the second inductor of the LC parallel resonator on the second input/output stage side of the intermediate stage and the inductor of the LC parallel resonator at the second input/output stage.

Furthermore, a band pass filter according to a preferred embodiment of the present invention is configured such that the band pass filter has a multilayer body in which a plurality of insulating layers are laminated one on top of another. The inductors of the LC parallel resonators are each defined by a spiral electrode that includes a line electrode between specified layers of the multilayer body and a via electrode that penetrates through specified insulating layers of the multilayer body. The capacitors of the LC parallel resonators are defined by capacitor electrodes formed between specified layers of the multilayer body. When the multilayer body is seen in the laminate direction, the spiral electrode of the first inductor of the at least one LC parallel resonator or at least one of the LC parallel resonators at the intermediate stage is superposed on the spiral electrode of the inductor of the one of the adjacent LC parallel resonators in an equivalent circuit, and the spiral electrode of the second inductor of the at least one LC parallel resonator or the at least one of the LC parallel resonators at the intermediate stage is superposed on the spiral electrode of the inductor of the other adjacent LC parallel resonator in the equivalent circuit. In this case, the strength of the magnetic coupling between the first inductor of the at least one LC parallel resonator or the at least one of the LC parallel resonators at the intermediate stage and the inductor of the one of the adjacent LC parallel resonators in the equivalent circuit is increased, and the strength of the magnetic coupling between the second inductor of the at least one LC parallel resonator or the at least one of the LC parallel resonators at the intermediate stage and the inductor of the other adjacent LC parallel resonator in the equivalent circuit is increased.

The shape of the spiral electrode of the first inductor and the shape of the spiral electrode of the second inductor may be, for example. In this case, the ratio of the inductance value of the first inductor to the inductance value of the second inductor is able to be easily set to 1:1. Here, setting the ratio of the inductance value to 1:1 indicates that the ratio of the inductance value is substantially 1:1 with slight variation in inductance value caused by errors in the manufacture or the like of the band pass filter excluded. Furthermore, the strength of the magnetic coupling between the first inductor and the inductor of the one of the adjacent LC parallel resonators in the equivalent circuit and the strength of the magnetic coupling between the second inductor and the inductor of the other adjacent LC parallel resonator in the equivalent circuit are able to be easily equalized. The description that the shape of the spiral electrode of the first inductor and the shape of the spiral electrode of the second inductor are identical to each other indicates that the shapes of the both are identical or substantially identical to each other with errors in the manufacture or the like excluded.

Furthermore, when the multilayer body is seen in the laminate direction, a winding direction of the spiral electrode of the first inductor of the at least one LC parallel resonator or at least one of the LC parallel resonators at the intermediate stage may be coincident with a winding direction of the spiral electrode of the inductor of the one of the adjacent LC parallel resonators in the equivalent circuit, and, in addition, a winding direction of the spiral electrode of the second inductor of the at least one LC parallel resonator or the at least one of the LC parallel resonators at the intermediate stage may be coincident with a winding direction of the spiral electrode of the inductor of the other adjacent LC parallel resonator in the equivalent circuit. In this case, the strength of the magnetic coupling between the first inductor of the at least one LC parallel resonator or the at least one of the LC parallel resonators at the intermediate stage and the inductor of the one of the adjacent LC parallel resonators in the equivalent circuit is able to be increased, and the strength of the magnetic coupling between the second inductor of the at least one LC parallel resonator or the at least one of the LC parallel resonators at the intermediate stage and the inductor of the other adjacent LC parallel resonator in the equivalent circuit is able to be increased. The state that the winding directions of the spiral electrodes are coincident with each other indicates that the winding directions are coincident with each other in most portions of the spiral electrodes. In this case, the winding directions may be opposite to each other in a very small number of portions to meet the needs in pattern designing.

Furthermore, when the multilayer body is seen in the laminate direction, the winding direction of the spiral electrode of the first inductor of the at least one LC parallel resonator or at least one of the LC parallel resonators at the intermediate stage may be opposite to the winding direction of the spiral electrode of the inductor of the one of the adjacent LC parallel resonators in the equivalent circuit, and in addition, the winding direction of the spiral electrode of the second inductor of the at least one LC parallel resonator or the at least one of the LC parallel resonators at the intermediate stage may be opposite to the winding direction of the spiral electrode of the inductor of the other adjacent LC parallel resonator in the equivalent circuit. In this case, the strength of the magnetic coupling between the first inductor of the at least one LC parallel resonator or the at least one of the LC parallel resonators at the intermediate stage and the inductor of the one of the adjacent LC parallel resonators in the equivalent circuit is able to be decreased, and the strength of the magnetic coupling between the second inductor of the at least one LC parallel resonator or the at least one of the LC parallel resonators at the intermediate stage and the inductor of the other adjacent LC parallel resonator in the equivalent circuit is able to be decreased. The state that the winding directions of the spiral electrodes are opposite to each other indicates that the winding directions are opposite to each other in most portions of the spiral electrodes. In this case, the winding directions may be coincident with each other in a very small number of portions to meet the needs in pattern designing.

Furthermore, when the multilayer body is seen in the laminate direction, the winding direction of the spiral electrode of the first inductor of the at least one LC parallel resonator or at least one of the LC parallel resonators at the intermediate stage may be coincident with the winding direction of the spiral electrode of the inductor of the one of the adjacent LC parallel resonators in the equivalent circuit, and, in addition, the winding direction of the spiral electrode of the second inductor of the at least one LC parallel resonator or the at least one of the LC parallel resonators at the intermediate stage may be opposite to the winding direction of the spiral electrode of the inductor of the other adjacent LC parallel resonator in the equivalent circuit. Alternatively, the winding direction of the spiral electrode of the first inductor of the at least one LC parallel resonator or the at least one of the LC parallel resonators at the intermediate stage may be opposite to the winding direction of the spiral electrode of the inductor of the one of the adjacent LC parallel resonators in the equivalent circuit, and, in addition, the winding direction of the spiral electrode of the second inductor of the at least one LC parallel resonator or the at least one of the LC parallel resonators at the intermediate stage may be coincident with the winding direction of the spiral electrode of the inductor of the other adjacent LC parallel resonator in the equivalent circuit. In this case, one of the strengths of the following magnetic couplings is able to be increased and the other of the following strengths of the magnetic couplings is able to be decreased: the magnetic coupling between the first inductor of the at least one LC parallel resonator or the at least one of the LC parallel resonators at the intermediate stage and the inductor of the one of the adjacent LC parallel resonators in the equivalent circuit; and the magnetic coupling between the second inductor of the at least one LC parallel resonator or the at least one of the LC parallel resonators at the intermediate stage and the inductor of the other adjacent LC parallel resonator in the equivalent circuit.

In band pass filters according to preferred embodiments of the present invention, the inductor of the at least one LC parallel resonator at the intermediate stage is divided into the first inductor and the second inductor connected in parallel with each other. In addition, the first inductor is magnetically coupled to the inductor of the one of the adjacent LC parallel resonators, and the second inductor is magnetically coupled to the inductor of the other adjacent LC parallel resonator. Thus, the strength of the magnetic coupling between the first inductor and the inductor of the one of the adjacent LC parallel resonators and the strength of the magnetic coupling between the second inductor and the inductor of the other adjacent LC parallel resonator are able to be easily adjusted. For example, both the strengths are able to be easily equalized.

Furthermore, laminate band pass filters according to preferred embodiments of the present invention include multilayer bodies in which insulating layers are laminated. Thus, the strength of the magnetic coupling between the first inductor and the inductor of the one of the adjacent LC parallel resonators and the strength of the magnetic coupling between the second inductor and the inductor of the other adjacent LC parallel resonator are able to be easily adjusted. For example, both the strengths are able to be easily equalized. Furthermore, in laminate band pass filters according to preferred embodiments of the present invention, when the multilayer body is seen in the laminate direction, the spiral electrode of the first inductor of the at least one LC parallel resonator or the at least one of the LC parallel resonators at the intermediate stage is superposed on the spiral electrode of the inductor of the one of the adjacent LC parallel resonators in the equivalent circuit, and the spiral electrode of the second inductor of the at least one LC parallel resonator or the at least one of the LC parallel resonators at the intermediate stage is superposed on the spiral electrode of the inductor of the other adjacent LC parallel resonator in the equivalent circuit. Thus, the strength of the magnetic coupling between the first inductor of the at least one LC parallel resonator or the at least one of the LC parallel resonators at the intermediate stage and the inductor of the one of the adjacent LC parallel resonators in the equivalent circuit is increased, and the strength of the magnetic coupling between the second inductor of the at least one LC parallel resonator or the at least one of the LC parallel resonators at the intermediate stage and the inductor of the other adjacent LC parallel resonator in the equivalent circuit is increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
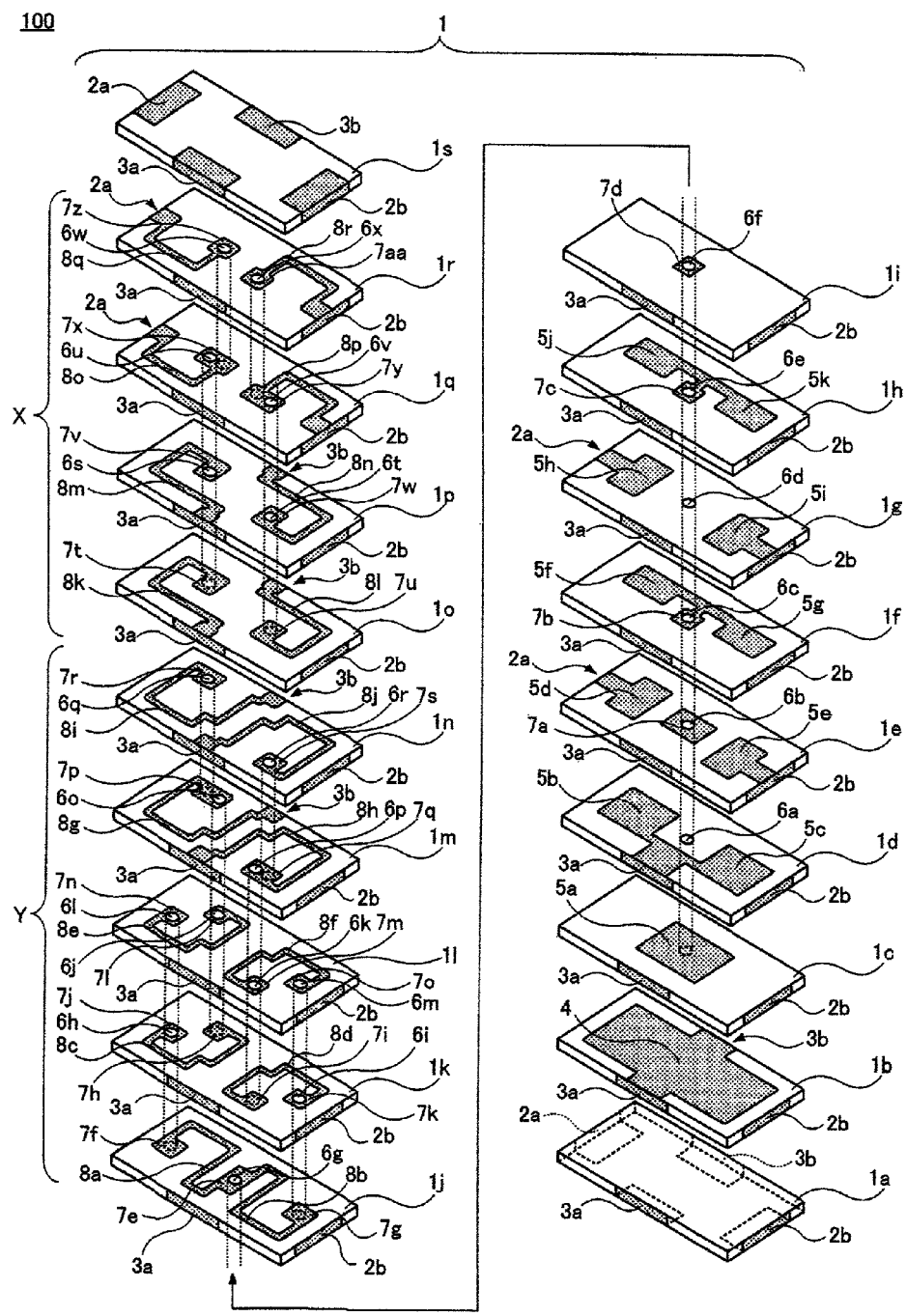
FIG. 1 is an exploded perspective view of a band pass filter 100 according to a first preferred embodiment of the present invention.

Preferred embodiments of the present invention will be described below with reference to the drawings.

It should be noted that the preferred embodiments exemplify the preferred embodiments of present invention, and the present invention is not limited to content of the preferred embodiments. It is possible to embody a combination of types of content described in the different preferred embodiments, and the embodied content in such cases is also included in the present invention. Furthermore, the drawings are provided to help understanding of the preferred embodiments and are not necessarily exactly drawn. For example, the ratios of the dimensions in drawn elements or between drawn elements do not necessarily coincide with those described in the description. Furthermore, elements described in the description may be omitted from the drawings or decreased in number in the drawings.

First Preferred Embodiment

Figure 2:
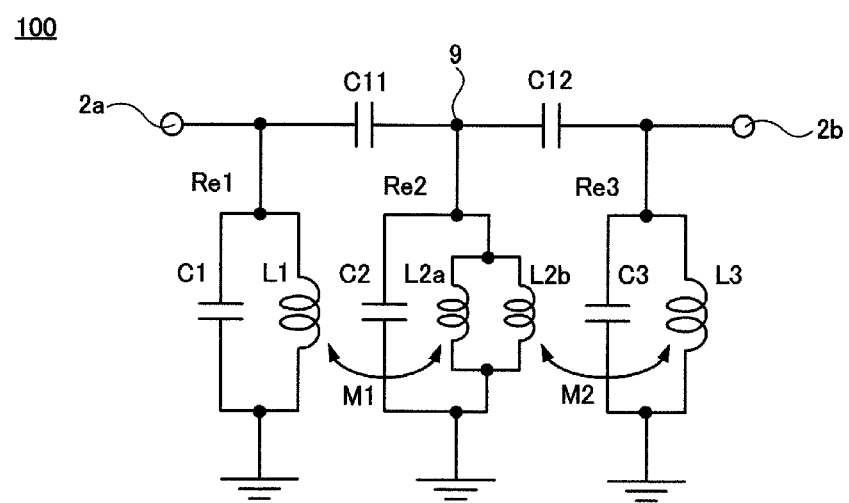
FIG. 2 is an equivalent circuit diagram of the band pass filter 100.

FIGS. 1 and 2 illustrate a band pass filter 100 according to a first preferred embodiment of the present invention. In more detail, FIG. 1 is an exploded perspective view of the band pass filter 100 when the band pass filter 100 includes a multilayer body in which laminate insulating layers are laminated. FIG. 2 is a diagram in which the configuration of the exploded perspective view illustrated in FIG. 1 is replaced with an equivalent circuit.

As illustrated in FIG. 1, the band pass filter 100 includes a multilayer body 1 in which 19 insulating layers 1a to 1s are sequentially laminated from the bottom. The multilayer body 1 preferably has a rectangular or substantially rectangular parallelepiped shape.

The insulating layers 1a to 1s are preferably made of ceramic. Each of the insulating layers 1a to 1s can also be a dielectric layer having a dielectric constant.

The insulating layer 1a having a rectangular or substantially rectangular shape includes four side surfaces on which a first input/output terminal 2a, a first ground terminal 3a, a second input/output terminal 2b, and a second ground terminal 3b are respectively arranged in this order. Each of the first input/output terminal 2a, the second input/output terminal 2b, the first ground terminal 3a, and the second ground terminal 3b extends on another main surface (lower main surface in FIG. 1) of the insulating layer 1a.

The first input/output terminal 2a, the second input/output terminal 2b, the first ground terminal 3a, and the second ground terminal 3b are made of, for example, metal the principal component of which is, for example, Ag, Cu, or an alloy of these. A single or a plurality of plated layers the principal component of which is, for example, Ni, Sn, or Au are provided on the surface of each of the first input/output terminal 2a, the second input/output terminal 2b, the first ground terminal 3a, and the second ground terminal 3b according to need.

The first input/output terminal 2a, the second input/output terminal 2b, the first ground terminal 3a, and the second ground terminal 3b are also provided on corresponding side surfaces of each of the insulating layers 1b to 1s that will be described hereafter. However, description thereof may be omitted in the following description.

The insulating layer 1b has a rectangular or substantially rectangular shape. A ground electrode 4 is provided on one main surface (upper main surface in FIG. 1) of the insulating layer 1b. The ground electrode 4a is connected to the first ground terminal 3a and the second ground terminal 3b.

The insulating layer 1c has a rectangular or substantially rectangular shape. A capacitor electrode 5a is provided on one main surface of the insulating layer 1c.

The insulating layer 1d having a rectangular or substantially rectangular shape includes a via electrode 6a that penetrates therethrough between both main surfaces thereof. Furthermore, capacitor electrodes 5b and 5c are provided on the one main surface of the insulating layer 1d. The capacitor electrodes 5b and 5c are connected to the first ground terminal 3a. The via electrode 6a is connected to the capacitor electrode 5a provided on the insulating layer 1c.

The insulating layer 1e having a rectangular or substantially rectangular shape includes a via electrode 6b that penetrates therethrough between both main surfaces thereof. Furthermore, a connecting electrode 7a is provided on the one main surface of the insulating layer 1e, and capacitor electrodes 5d and 5e are provided on the one main surface of the insulating layer 1e such that the connecting electrode 7a is interposed between the capacitor electrodes 5d and 5e. The capacitor electrode 5d is connected to the first input/output terminal 2a, and the capacitor electrode 5e is connected to the second input/output terminal 2b. The via electrode 6b is connected to the connecting electrode 7a and the via electrode 6a, which is provided on the insulating layer 1d.

The insulating layer 1f having a rectangular or substantially rectangular shape includes a via electrode 6c that penetrates therethrough between both main surfaces thereof. Furthermore, a connecting electrode 7b is provided on the one main surface of the insulating layer 1f, and capacitor electrodes 5f and 5g are provided on the one main surface of the insulating layer 1f such that the connecting electrode 7b is interposed between the capacitor electrodes 5f and 5g. The capacitor electrodes 5f and 5g are connected to the connecting electrode 7b. The via electrode 6c is connected to the connecting electrode 7b and the via electrode 6b, which is provided on the insulating layer 1e.

The insulating layer 1g having a rectangular or substantially rectangular shape includes a via electrode 6d that penetrates therethrough between both main surfaces thereof. Furthermore, capacitor electrodes 5h and 5i are provided on the one main surface of the insulating layer 1g such that the via electrode 6d is interposed between the capacitor electrodes 5h and 5i. The capacitor electrode 5h is connected to the first input/output terminal 2a, and the capacitor electrode 5i is connected to the second input/output terminal 2b. The via electrode 6d is connected to the via electrode 6c provided on the insulating layer 1f.

The insulating layer 1h having a rectangular or substantially rectangular shape includes a via electrode 6e that penetrates therethrough between both main surfaces thereof. Furthermore, a connecting electrode 7c is provided on the one main surface of the insulating layer 1h, and capacitor electrodes 5j and 5k are provided on the one main surface of the insulating layer 1h such that the connecting electrode 7c is interposed between the capacitor electrodes 5j and 5k. The capacitor electrodes 5j and 5k are connected to the connecting electrode 7c. The via electrode 6e is connected to the connecting electrode 7c and the via electrode 6d, which is provided on the insulating layer 1g.

The insulating layer 1i having a rectangular or substantially rectangular shape includes a via electrode 6f that penetrates therethrough between both main surfaces thereof. Furthermore, a connecting electrode 7d is provided on the one main surface of the insulating layer 1i. The via electrode 6f is connected to the connecting electrode 7d and the via electrode 6e, which is provided on the insulating layer 1h.

The insulating layer 1j having a rectangular or substantially rectangular shape includes a via electrode 6g that penetrates therethrough between both main surfaces thereof. Furthermore, connecting electrodes 7e, 7f, and 7g and line electrodes 8a and 8b are provided on the one main surface of the insulating layer 1j. The line electrode 8a has one end connected to the connecting electrode 7e and the other end connected to the connecting electrode 7f. The line electrode 8b has one end connected to the connecting electrode 7e and the other end connected to the connecting electrode 7g. The via electrode 6g is connected to the connecting electrode 7e and the via electrode 6f, which is provided on the insulating layer 1i.

The insulating layer 1k having a rectangular or substantially rectangular shape includes via electrodes 6h and 6i that penetrate therethrough between both main surfaces thereof. Furthermore, connecting electrodes 7h, 7i, 7j, and 7k and line electrodes 8c and 8d are provided on the one main surface of the insulating layer 1k. The line electrode 8c has one end connected to the connecting electrode 7h and the other end connected to the connecting electrode 7j. The line electrode 8d has one end connected to the connecting electrode 7i and the other end connected to the connecting electrode 7k. The via electrode 6h is connected to the connecting electrode 7j and the connecting electrode 7f, which is provided on the insulating layer 1j. The via electrode 6i is connected to the connecting electrode 7k and the connecting electrode 7g, which is provided on the insulating layer 1j.

The insulating layer 1l having a rectangular or substantially rectangular shape includes via electrodes 6j, 6k, 6l, and 6m that penetrate therethrough between both main surfaces thereof. Furthermore, connecting electrodes 7l, 7m, 7n, and 7o and line electrodes 8e and 8f are provided on the one main surface of the insulating layer 1l. The line electrode 8e has one end connected to the connecting electrode 7l and the other end connected to the connecting electrode 7n. The line electrode 8f has one end connected to the connecting electrode 7m and the other end connected to the connecting electrode 7o. The via electrode 6j is connected to the connecting electrode 7l and the connecting electrode 7h, which is provided on the insulating layer 1k. The via electrode 6k is connected to the connecting electrode 7m and the connecting electrode 7i, which is provided on the insulating layer 1k. The via electrode 6l is connected to the connecting electrode 7n and the via electrode 6h, which is provided on the insulating layer 1k. The via electrode 6m is connected to the connecting electrode 7o and the via electrode 6i, which is provided on the insulating layer 1k.

The insulating layer 1m having a rectangular or substantially rectangular shape includes via electrodes 6o and 6p that penetrate therethrough between both main surfaces thereof. Furthermore, connecting electrodes 7P and 7q and line electrodes 8g and 8h are provided on the one main surface of the insulating layer 1m. The line electrode 8g has one end connected to the connecting electrode 7p and the other end connected to the second ground terminal 3b. The line electrode 8h has one end connected to the connecting electrode 7q and the other end connected to the first ground terminal 3a. The via electrode 6o is connected to the connecting electrode 7p and the via electrode 6j, which is provided on the insulating layer 1l. The via electrode 6p is connected to the connecting electrode 7q and the via electrode 6k, which is provided on the insulating layer 1l.

The insulating layer 1n having a rectangular or substantially rectangular shape includes via electrodes 6q and 6r that penetrate therethrough between both main surfaces thereof. Furthermore, connecting electrodes 7r and 7s and line electrodes 8i and 8j are provided on the one main surface of the insulating layer 1n. The line electrode 8i has one end connected to the connecting electrode 7r and the other end connected to the second ground terminal 3b. The line electrode 8j has one end connected to the connecting electrode 7s and the other end connected to the first ground terminal 3a. The via electrode 6q is connected to the connecting electrode 7r and the connecting electrode 7p, which is provided on the insulating layer 1m. The via electrode 6r is connected to the connecting electrode 7s and the connecting electrode 7q, which is provided on the insulating layer 1m.

The insulating layer 1o has a rectangular or substantially rectangular shape. Connecting electrodes 7t and 7u and line electrodes 8k and 8l are provided on one main surface of the insulating layer 1o. The line electrode 8k has one end connected to the connecting electrode 7t and the other end connected to the first ground terminal 3a. The line electrode 8l has one end connected to the connecting electrode 7u and the other end connected to the second ground terminal 3b.

The insulating layer 1p having a rectangular or substantially rectangular shape includes a via electrodes 6s and 6t that penetrate therethrough between both main surfaces thereof. Furthermore, connecting electrodes 7v and 7w and line electrodes 8m and 8n are provided on the one main surface of the insulating layer 1p. The line electrode 8m has one end connected to the connecting electrode 7v and the other end connected to the first ground terminal 3a. The line electrode 8n has one end connected to the connecting electrode 7w and the other end connected to the second ground terminal 3b. The via electrode 6s is connected to the connecting electrode 7v and the connecting electrode 7t, which is provided on the insulating layer 1o. The via electrode 6t is connected to the connecting electrode 7w and the connecting electrode 7u, which is provided on the insulating layer 1o.

The insulating layer 1q having a rectangular or substantially rectangular shape has via electrodes 6u and 6v that penetrates therethrough between both main surfaces thereof. Furthermore, connecting electrodes 7x and 7y and line electrodes 8o and 8p are provided on the one main surface of the insulating layer 1q. The line electrode 8o has one end connected to the connecting electrode 7x and the other end connected to the first input/output terminal 2a. The line electrode 8p has one end connected to the connecting electrode 7y and the other end connected to the second input/output terminal 2b. The via electrode 6u is connected to the connecting electrode 7x and the via electrode 6s, which is provided on the insulating layer 1p. The via electrode 6v is connected to the connecting electrode 7y and the via electrode 6t, which is provided on the insulating layer 1p.

The insulating layer 1r having a rectangular or substantially rectangular shape includes via electrodes 6w and 6x that penetrate therethrough between both main surfaces thereof. Furthermore, connecting electrodes 7z and 7aa and line electrodes 8q and 8r are provided on the one main surface of the insulating layer 1r. The line electrode 8q has one end connected to the connecting electrode 7z and the other end connected to the first input/output terminal 2a. The line electrode 8r has one end connected to the connecting electrode 7aa and the other end connected to the second input/output terminal 2b. The via electrode 6w is connected to the connecting electrode 7z and the connecting electrode 7x, which is provided on the insulating layer 1q. The via electrode 6x is connected to the connecting electrode 7aa and the connecting electrode 7y, which is provided on the insulating layer 1q.

The insulating layer is having a rectangular or substantially rectangular shape includes four side surfaces on which the first input/output terminal 2a, the first ground terminal 3a, the second input/output terminal 2b, and the second ground terminal 3b are respectively provided on this order. Each of the first input/output terminal 2a, the second input/output terminal 2b, the first ground terminal 3a, and the second ground terminal 3b also extend in one main surface (upper main surface in FIG. 1) of the insulating layer 1a.

The ground electrode 4, the capacitor electrodes 5a to 5k, the via electrodes 6a to 6x, the connecting electrodes 7a to 7aa, and the line electrodes 8a to 8r are made of, for example, metal the principal component of which is Ag, Cu, or an alloy of these.

The band pass filter 100 according to the first preferred embodiment configured as described above has the equivalent circuit illustrated in FIG. 2.

The band pass filter 100 includes a first input/output terminal 2a and a second input/output terminal 2b.

Two capacitive coupling capacitors C11 and C12 connected in series at a node 9 are connected between the first input/output terminal 2a and the second input/output terminal 2b.

The band pass filter 100 includes an LC parallel resonator Re1 at a first input/output stage, a single LC parallel resonator Re2 at an intermediate stage, and an LC parallel resonator Re3 at a second input/output stage.

The LC parallel resonator Re1 at the first input/output stage includes an inductor L1 and a capacitor C1 connected in parallel with each other. One end of the LC parallel resonator Re1 at the first input/output stage is connected between the first input/output terminal 2a and the capacitor C11. The other end of the LC parallel resonator Re1 at the first input/output is connected to a ground terminal.

The LC parallel resonator Re2 at the intermediate stage includes a first inductor L2a and a second inductor L2b, which are connected in parallel with each other, and a capacitor C2, which is connected in parallel with the first inductor L2a and the second inductor L2b. One end of the LC parallel resonator Re2 at the intermediate stage is connected to the node 9 where the capacitor C11 and the capacitor C12 are connected. The other end of the LC parallel resonator Re2 at the intermediate stage is connected to a ground terminal.

The LC parallel resonator Re3 at the second input/output stage includes an inductor L3 and a capacitor C3 connected in parallel with each other. One end of the LC parallel resonator Re3 at the second input/output stage is connected between the capacitor C12 and the second input/output terminal 2b. The other end of the LC parallel resonator Re3 at the second input/output stage is connected to a ground terminal.

In the band pass filter 100, the inductor L1 of the LC parallel resonator Re1 at the first input/output stage and the first inductor L2a of the LC parallel resonator Re2 at the intermediate stage are in magnetic coupling M1 with each other. Furthermore, the second inductor L2b of the LC parallel resonator Re2 at the intermediate stage and the inductor L3 of the LC parallel resonator Re3 at the second input/output stage are in magnetic coupling M2 with each other.

In the band pass filter 100, the inductor of the LC parallel resonator Re2 at the intermediate stage is divided into the first inductor L2a and the second inductor L2b. Accordingly, the strength of the magnetic coupling M1 and the strength of the magnetic coupling M2 are easily adjusted. For example, the strength of the magnetic coupling M1 and the strength of the magnetic coupling M2 are able to be easily equalized. Furthermore, each of the strength of the magnetic coupling M1 and the strength of the magnetic coupling M2 is able to be independently adjusted.

Next, referring to FIGS. 1 and 2, the relationship between the structure of the laminate band pass filter 100 and the equivalent circuit of the laminate band pass filter 100 is described.

It is noted that, in order to improve a Q factor, line electrodes may be provided in two layers so as to define an inductor in the band pass filter 100.

The inductor L1 of the LC parallel resonator Re1 at the first input/output stage illustrated in FIG. 2 is provided on a portion extending through the insulating layers 1o to 1r illustrated in FIG. 1. For ease of illustration, the portion extending through the insulating layers 1o to 1r illustrated in FIG. 1 is represented as a region X.

The inductor L1 is defined by the following path. First, the path from the first input/output terminals 2a passes through the line electrodes 8o and 8q in two layers and is connected to the connecting electrodes 7x and 7z connected to each other through the via electrode 6w. Next, from the connecting electrodes 7x and 7z connected to each other through the via electrode 6w, the path passes through the via electrode 6u and is connected to the connecting electrodes 7t and 7v connected to each other through the via electrode 6s. Next, from the connecting electrodes 7t and 7v connected to each other through the via electrode 6s, the path passes through the line electrodes 8k and 8m in two layers and is connected to the first ground terminals 3a.

That is, the inductor L1 is defined by a spiral electrode that connects the first input/output terminals 2a, the line electrodes 8o and 8q in two layers, the connecting electrodes 7x and 7z connected to each other through the via electrode 6w, the via electrode 6u, the connecting electrodes 7t and 7v connected to each other through the via electrode 6s, the line electrodes 8k and 8m in two layers, and the first ground terminals 3a.

The capacitor C1 of the LC parallel resonator Re1 at the first input/output stage is provided on a portion extending through the insulating layers 1d and 1e.

The capacitor C1 is defined by capacitance generated between the capacitor electrodes 5b and 5d. The first input/output terminal 2a is connected to the capacitor electrode 5d, and the first ground terminal 3a is connected to the capacitor electrode 5b.

The capacitive coupling capacitor C11 is provided on a portion extending through the insulating layers 1e to 1h. The capacitor C11 is mainly defined by capacitance generated between one set of the capacitor electrodes 5d and 5h and the other set of the capacitor electrodes 5f and 5j. The first input/output terminals 2a are connected to the capacitor electrodes 5d and 5h. The capacitor electrodes 5f and 5j are, through the connecting electrodes 7b and 7c, connected to seven vertically connected via electrodes 6a to 6g.

The via electrodes 6a to 6g correspond to the node 9 where the capacitive coupling capacitors C11 and C12 are connected to each other in the equivalent circuit illustrated in FIG. 2.

The first inductor L2a and the second inductor L2b of the LC parallel resonator Re2 at the intermediate stage illustrated in FIG. 2 are provided on a portion extending through the insulating layers 1j to 1n illustrated in FIG. 1. For ease of illustration, the portion extending through the insulating layers 1j to 1n illustrated in FIG. 1 is represented as a region Y.

The first inductor L2a of the LC parallel resonator Re2 at the intermediate stage is defined by the following path. First, the via electrode 6g out of the via electrodes 6a to 6g that are the node 9 where the capacitive coupling capacitors C11 and C12 are connected to each other is connected to the connecting electrode 7e. Next, the path from the connecting electrode 7e is connected to the connecting electrode 7f through the line electrode 8a. Next, the path from the connecting electrode 7f passes through the via electrode 6h and is connected to the connecting electrodes 7j and 7n connected to each other through the via electrode 6l. Next, from the connecting electrodes 7j and 7n connected to each other through the via electrode 6l, the path passes through the line electrodes 8c and 8e in two layers and is connected to the connecting electrodes 7h and 7l connected to each other through the via electrode 6j. Next, from the connecting electrodes 7h and 7l connected to each other through the via electrode 6j, the path passes through the via electrode 6o and is connected to the connecting electrodes 7p and 7r connected to each other through the via electrode 6q. Next, from the connecting electrodes 7p and 7r connected to each other through the via electrode 6q, the path passes through the line electrodes 8g and 8i in two layers and is connected to the second ground terminals 3b.

That is, the first inductor L2a is defined by a spiral electrode that connects the via electrode 6g out of the via electrodes 6a to 6g that is the node 9 where the capacitive coupling capacitors C11 and C12 are connected to each other, the connecting electrode 7e, the line electrode 8a, the connecting electrodes 7f, the via electrode 6h, the connecting electrodes 7j and 7n connected to each other through the via electrode 6l, the line electrodes 8c and 8e in two layers, the connecting electrodes 7h and 7l connected to each other through the via electrode 6j, the via electrode 6o, the connecting electrodes 7p and 7r connected to each other through the via electrode 6q, the line electrodes 8g and 8i in two layers, and the second ground terminals 3b.

Likewise, the second inductor L2b of the LC parallel resonator Re2 at the intermediate stage is defined by the following path. First, the via electrode 6g out of the via electrodes 6a to 6g that are the node 9 where the capacitive coupling capacitors C11 and C12 are connected to each other is connected to the connecting electrode 7e. Next, the path from the connecting electrode 7e is connected to the connecting electrode 7g through the line electrode 8b. Next, the path from the connecting electrode 7g passes through the via electrode 6i and is connected to the connecting electrodes 7k and 7o connected to each other through the via electrode 6m. Next, from the connecting electrodes 7k and 7o connected to each other through the via electrode 6m, the path passes through the line electrodes 8d and 8f in two layers and is connected to the connecting electrodes 7i and 7m connected to each other through the via electrode 6k. Next, from the connecting electrodes 7i and 7m connected to each other through the via electrode 6k, the path passes through the via electrode 6p and is connected to the connecting electrodes 7*q* and 7*s* connected to each other through the via electrode 6*r*. Next, from the connecting electrodes 7*q* and 7*s* connected to each other through the via electrode 6*r*, the path passes through the line electrodes 8*h* and 8*j* in two layers and is connected to the first ground terminals 3*a*.

That is, the second inductor L2*b* is defined by a spiral electrode that connects the via electrode 6*g* out of the via electrodes 6*a* to 6*g* that is the node 9 where the capacitive coupling capacitors C11 and C12 are connected to each other, the connecting electrode 7*e*, the line electrode 8*b*, the connecting electrodes 7*g*, the via electrode 6*i*, the connecting electrodes 7*k* and 7*o* connected to each other through the via electrode 6*m*, the line electrodes 8*d* and 8*f* in two layers, the connecting electrodes 7*i* and 7*m* connected to each other through the via electrode 6*k*, the via electrode 6*p*, the connecting electrodes 7*q* and 7*s* connected to each other through the via electrode 6*r*, the line electrodes 8*h* and 8*j* in two layers, and the first ground terminals 3*a*.

The capacitor C2 of the LC parallel resonator Re2 at the intermediate stage is provided on a portion extending through the insulating layers 1*b* and 1*c*.

The capacitor C2 is defined by capacitance generated between the capacitor electrode 5*a* and the ground electrode 4.

The capacitor electrode 5*a* is connected to the via electrode 6*a* out of the via electrodes 6*a* to 6*g* that are the node where the capacitive coupling capacitors C11 and C12 are connected to each other. The ground electrode 4 is connected to the first ground terminal 3*a* and the second ground terminal 3*b*.

The capacitive coupling capacitor C12 is provided on a portion extending through the insulating layers 1*e* to 1*h*. The capacitor C11 is mainly defined by capacitance generated between one set of the capacitor electrodes 5*e* and 5*i* and the other set of the capacitor electrodes 5*g* and 5*k*. The second input/output terminals 2*b* are connected to the capacitor electrodes 5*e* and 5*i*. The capacitor electrodes 5*g* and 5*k* are, through the connecting electrodes 7*b* and 7*c*, connected to the via electrodes 6*a* to 6*g* that correspond to the node 9 where the capacitive coupling capacitors C11 and C12 are connected to each other.

The inductor L3 of the LC parallel resonator Re3 at the second input/output stage is, as is the case with the inductor L1 of the LC parallel resonator Re1 at the first input/output stage, provided on the region X that is a portion extending through the insulating layers 1*o* to 1*r* illustrated in FIG. 1.

The inductor L3 is defined by the following path. First, the path from the second input/output terminals 2*b* passes through the line electrodes 8*p* and 8*r* in two layers and is connected to the connecting electrodes 7*y* and 7*aa* connected to each other through the via electrode 6*x*. Next, from the connecting electrodes 7*y* and 7*aa* connected to each other through the via electrode 6*x*, the path passes through the via electrode 6*v* and is connected to the connecting electrodes 7*u* and 7*w* connected to each other through the via electrode 6*t*. Next, from the connecting electrodes 7*u* and 7*w* connected to each other through the via electrode 6*t*, the path passes through the line electrodes 8*l* and 8*n* in two layers and is connected to the second ground terminals 3*b*.

That is, the inductor L3 is defined by a spiral electrode that connects the second input/output terminals 2*b*, the line electrodes 8*p* and 8*r* in two layers, the connecting electrodes 7*y* and 7*aa* connected to each other through the via electrode 6*x*, the via electrode 6*v*, the connecting electrodes 7*u* and 7*w* connected to each other through the via electrode 6*t*, the line electrodes 8*l* and 8*n* in two layers, and the second ground terminals 3*b*.

The capacitor C3 of the LC parallel resonator Re3 at the second input/output stage is provided on a portion extending through the insulating layers 1*d* and 1*e*.

The capacitor C3 is defined by capacitance generated between the capacitor electrodes 5*c* and 5*e*. The second input/output terminal 2*b* is connected to the capacitor electrode 5*e*, and the first ground terminal 3*a* is connected to the capacitor electrode 5*c*.

Figure 3:
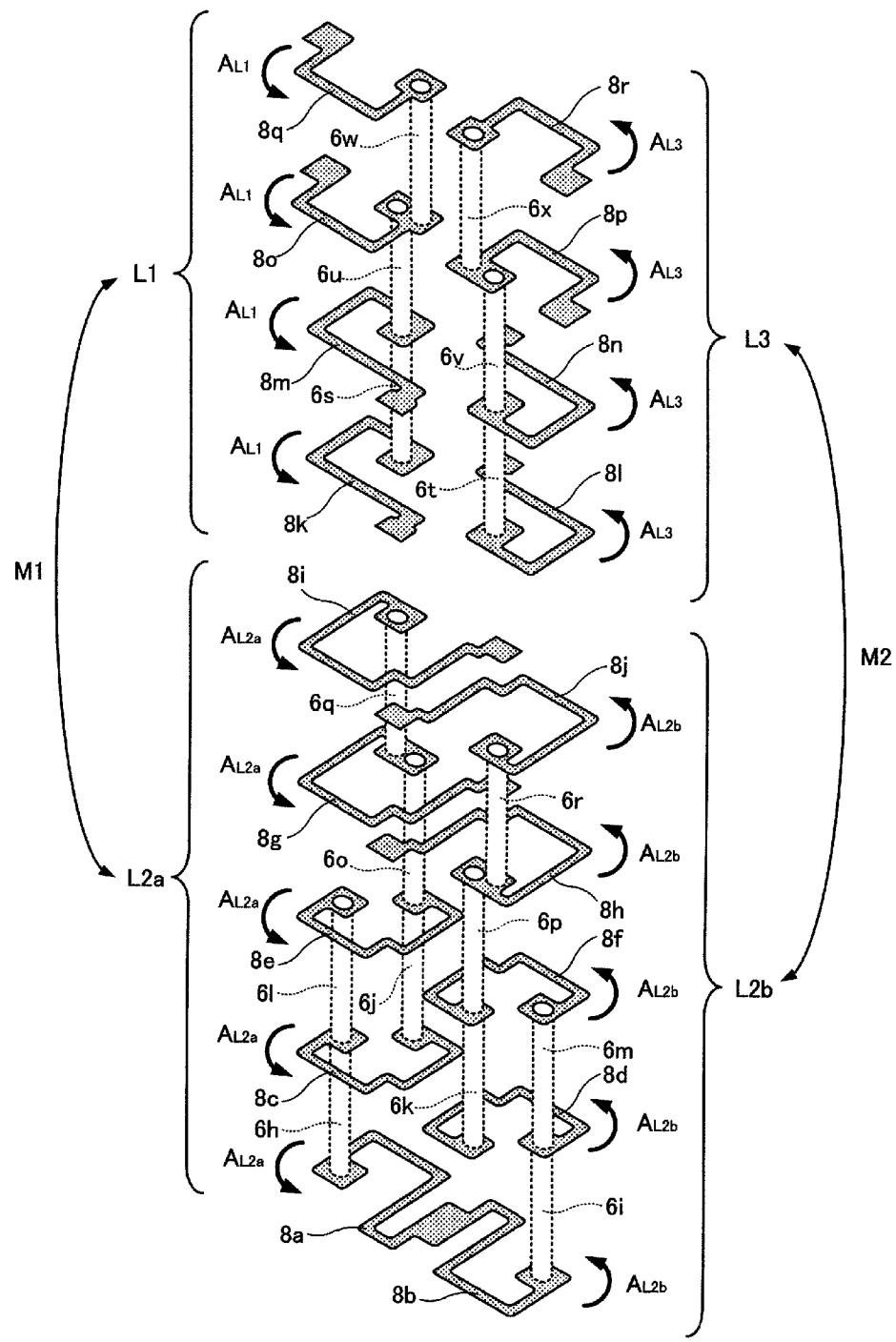
FIG. 3 is a conceptual view illustrating the positional relationships between an inductor of a first LC parallel resonator, first and second inductors of a second LC parallel resonator, and an inductor of a third LC parallel resonator in the band pass filter 100.

In the equivalent circuit of the band pass filter 100 according to the first preferred embodiment, the inductor of the LC parallel resonator Re2 at the intermediate stage is divided into the first inductor L1*a* and the second inductor L1*b*. Accordingly, the strength of the magnetic coupling M1 between the inductor L1 of the LC parallel resonator Re1 at the first input/output stage and the first inductor L2*a* of the LC parallel resonator Re2 at the intermediate stage and the strength of the magnetic coupling M2 between the second inductor L2*b* of the LC parallel resonator Re2 at the intermediate stage and the inductor L3 of the LC parallel resonator Re3 at the second input/output stage are able to be easily adjusted. For example, both the strengths are able to be easily equalized. Furthermore, both the strengths are each easily independently adjusted. FIG. 3 illustrates the positional relationship between the spiral electrode of the inductor L1 of the LC parallel resonator Re1 at the first input/output stage and the spiral electrode of the first inductor L2*a* of the LC parallel resonator Re2 at the intermediate stage and the positional relationship between the spiral electrode of the second inductor L2*b* of the LC parallel resonator Re2 at the intermediate stage and the spiral electrode of the inductor L3 of the LC parallel resonator Re3 at the second input/output stage when the band pass filter 100 is provided by using the multilayer body 1 (illustration is omitted in FIG. 3).

Furthermore, the direction of a current flowing through the spiral electrode of the inductor L1 is indicated by arrows $A_{L1}$, the direction of a current flowing through the spiral electrode of the first inductor L2*a* is indicated by arrows $A_{L2a}$, the direction of a current flowing through the spiral electrode of the second inductor L2*b* is indicated by arrows $A_{L2b}$, and the direction of a current flowing through the spiral electrode of the inductor L3 is indicated by arrows $A_{L3}$.

Furthermore, the magnetic coupling between the inductor L1 and the first inductor L2*a* is indicated by M1, and the magnetic coupling between the second inductor L2*b* and the inductor L3 is indicated by M2.

In the laminate band pass filter 100 according to the present preferred embodiment, when the multilayer body 1 is seen in a laminate direction, the spiral electrode of the inductor L1 of the LC parallel resonator Re1 at the first input/output stage and the spiral electrode of the first inductor L2*a* of the LC parallel resonator Re2 at the intermediate stage are superposed on each other. Thus, the magnetic coupling M1 between the inductor L1 and the first inductor L2*a* is strong. Likewise, the spiral electrode of the first inductor L2*a* of the LC parallel resonator Re2 at the intermediate stage and the spiral electrode of the inductor L3 of the LC parallel resonator Re at the second input/output stage are superposed on each other. Thus, the magnetic coupling M2 between the second inductor L2*b* and the inductor L3 is strong. Furthermore, in the multilayer body 1 of the band pass filter 100, the direction $A_{L1}$ of the current flowing through the spiral electrode of the inductor L1 of the LC parallel resonator Re1 at the first input/output stage and the direction $A_{L2a}$ of the current flowing through the spiral electrode of the first inductor L2*a* of the LC parallel resonator Re2 at the intermediate stage are coincident with each other. Thus, the directions of the magnetic fluxes generated by the inductor L1 and the first inductor L2a are the same. This increases the strength of the magnetic coupling M1. Likewise, the direction $A_{L2b}$ of the current flowing through the spiral electrode of the second inductor L2b of the LC parallel resonator Re2 at the intermediate stage and the direction $A_{L3}$ of the current flowing through the spiral electrode of the inductor L3 of the LC parallel resonator Re at the second input/output stage are coincident with each other. Thus, the directions of the magnetic fluxes generated by the second inductor L2b and the inductor L3 are the same. This increases the strength of the magnetic coupling M2.

Furthermore, in the multilayer body 1 of the band pass filter 100, the spiral electrode of the inductor L1 of the LC parallel resonator Re1 at the first input/output stage and the spiral electrode of the inductor L3 of the LC parallel resonator Re at the second input/output stage have the same shape and are symmetrical about a virtual axis (not illustrated) that extends through the center of the multilayer body 1 in the laminate direction. Likewise, the spiral electrode of the first inductor L2a of the LC parallel resonator Re2 at the intermediate stage and the spiral electrode of the second inductor L2b of the LC parallel resonator Re at the intermediate stage have the same shape and are formed symmetrically about the virtual axis (not illustrated) that extends through the center of the multilayer body 1 in the laminate direction. Accordingly, in the band pass filter 100, the strength of the magnetic coupling M1 between the inductor L1 of the LC parallel resonator Re1 at the first input/output stage and the first inductor L2a of the LC parallel resonator Re2 at the intermediate stage and the strength of the magnetic coupling M2 between the first inductor L2a of the LC parallel resonator Re2 at the intermediate stage and the inductor L3 of the LC parallel resonator Re at the second input/output stage are equal to each other. Here, the term "equal" indicates that both the strengths are equal or substantially equal to each other with variation caused by errors in the manufacture or the like of the band pass filter 100 excluded.

In the equivalent circuit of the band pass filter 100, as has been described, the inductor of the LC parallel resonator Re at the intermediate stage is divided into the spiral electrode of the first inductor L2a and the spiral electrode of the second inductor L2b having the same shape of the spiral electrode of the first inductor L2a. Accordingly, in the band pass filter 100, the inductor of the LC parallel resonator Re at the intermediate stage is divided into two portions such that the ratio of an inductance value of one of the portions to that of the other portion is 1:1.

In the band pass filter 100 according to the first preferred embodiment configured as above, the strength of the magnetic coupling M1 between the inductor L1 of the LC parallel resonator Re1 at the first input/output stage and the first inductor L2a of the LC parallel resonator Re2 at the intermediate stage and the strength of the magnetic coupling M2 between the second inductor L2b of the LC parallel resonator Re2 at the intermediate stage and the inductor L3 of the LC parallel resonator Re at the second input/output stage are equal or substantially equal to each other. Accordingly, the reflection characteristic on the first input/output terminal 2a side and the reflection characteristic on the second input/output terminal 2b side are coincident with each other in a region where the amount of reflection is large. As a result, in the band pass filter 100, impedance is preferably matched between one and the other input/output terminal sides.

Figure 4A:
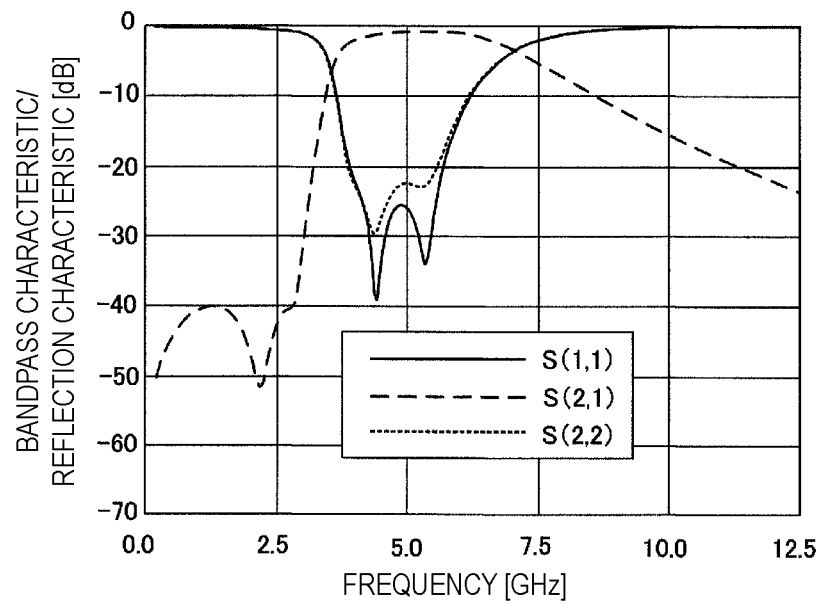
FIG. 4A illustrates the bandpass characteristic and the reflection characteristic of the band pass filter 100.
Figure 4B:
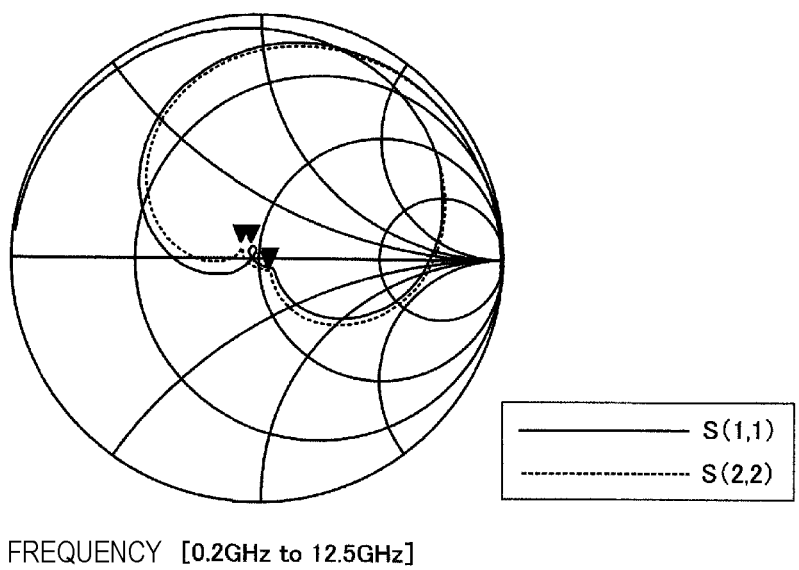
FIG. 4B is a Smith chart illustrating the impedance of the band pass filter 100.

FIG. 4A illustrates the bandpass characteristic and the reflection characteristic of the band pass filter 100. FIG. 4B illustrates the impedance of the band pass filter 100.

As can be seen from FIG. 4A, the reflection characteristic on the first input/output terminal 2a side and the reflection characteristic on the second input/output terminal 2b side are coincident with each other in a desired band. Thus, the band pass filter 100 has a good bandpass characteristic.

Furthermore, as can be seen from FIG. 4B, in the band pass filter 100, impedance is preferably matched between the one and the other input/output terminal sides in the desired band.

Figure 5:
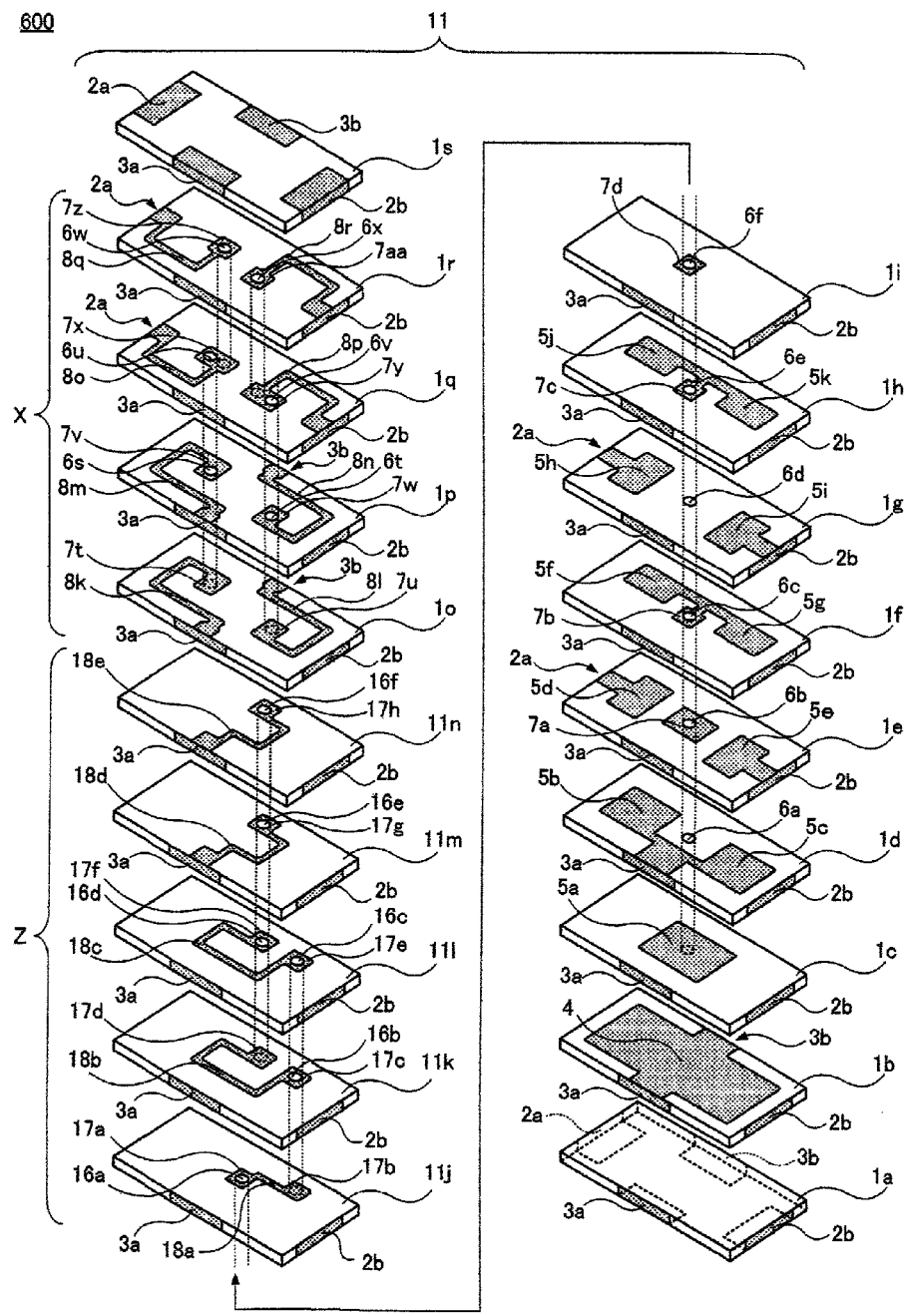
FIG. 5 is an exploded perspective view of a band pass filter 600 according to a comparative example.
Figure 6:
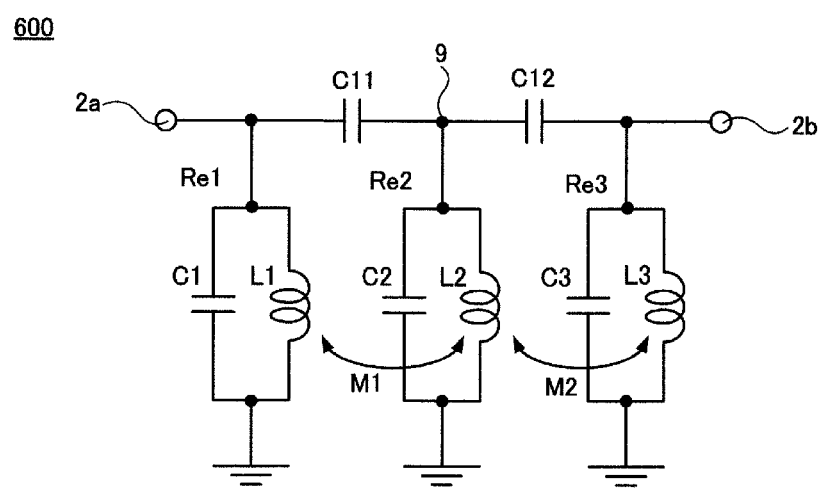
FIG. 6 is an equivalent circuit diagram of the band pass filter 600.
Figure 7A:
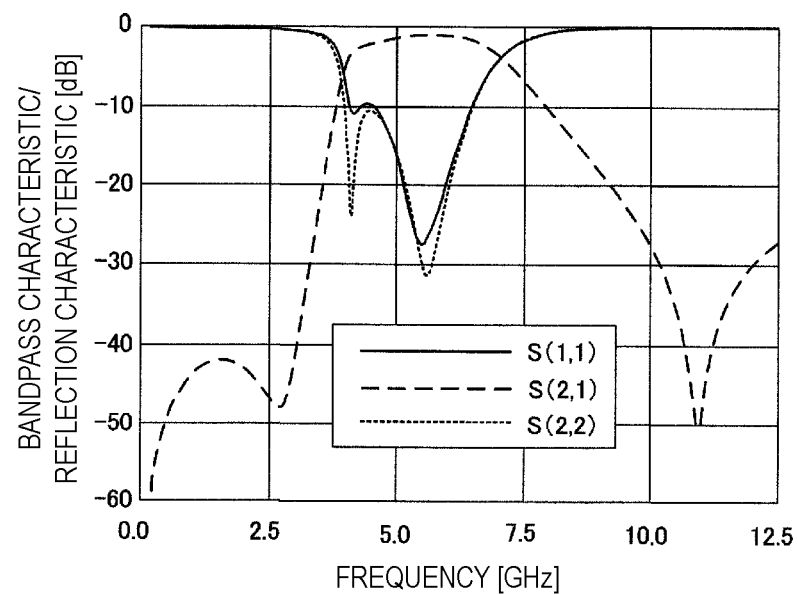
FIG. 7A illustrates the bandpass characteristic and the reflection characteristic of the band pass filter 600.
Figure 7B:
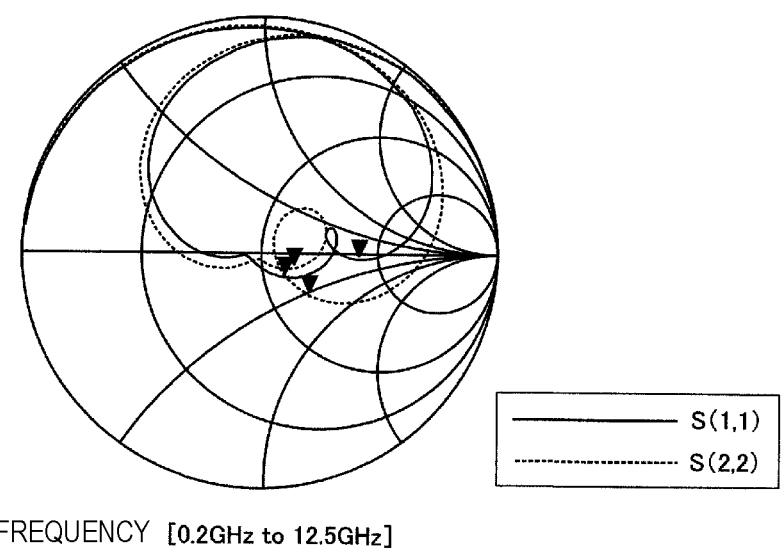
FIG. 7B is a Smith chart illustrating the impedance of the band pass filter 600.

For comparison, a band pass filter 600 according to a comparative example is prepared. FIG. 5 is an exploded perspective view of the band pass filter 600. FIG. 6 illustrates an equivalent circuit of the band pass filter 600. FIG. 7A illustrates the bandpass characteristic and the reflection characteristic of the band pass filter 600. FIG. 7B illustrates the impedance of the band pass filter 600.

As illustrated in FIGS. 5 and 6, in the band pass filter 600, the region Y, which includes the insulating layers 1j to 1n and in which the first inductor L2a and the second inductor L2b of the LC parallel resonator Re2 at the intermediate stage are provided on the band pass filter 100 according to the first preferred embodiment illustrated in FIGS. 1 and 2, is replaced with a region Z, which includes insulating layers 11j to 11n and in which an undivided inductor L2 of the LC parallel resonator Re2 at the intermediate stage is provided.

The configuration of the band pass filter 600 other than the above description is the same as that of the band pass filter 100. The region Z with which the region Y is replaced is described in detail below.

The insulating layer 11j includes a via electrode 16a that penetrates therethrough between both main surfaces thereof. Connecting electrodes 17a and 17b and a line electrode 18a are provided on one main surface of the insulating layer 11j. The line electrode 18a has one end connected to the connecting electrode 17a and the other end connected to the connecting electrode 17b. The via electrode 16a is connected to the connecting electrode 17a and the via electrode 6f, which is provided on the insulating layer 1i.

The insulating layer 11k includes a via electrode 16b that penetrates therethrough between both main surfaces thereof. Connecting electrodes 17c and 17d and a line electrode 18b are provided on one main surface of the insulating layer 11k. The line electrode 18b has one end connected to the connecting electrode 17c and the other end connected to the connecting electrode 17d. The via electrode 16b is connected to the connecting electrode 17c and the connecting electrode 17b, which is provided on the insulating layer 11j.

The insulating layer 11l includes a via electrodes 16c and 16d that penetrates therethrough between both main surfaces thereof. Connecting electrodes 17e and 17f and a line electrode 18c are provided on one main surface of the insulating layer 11l. The line electrode 18c has one end connected to the connecting electrode 17e and the other end connected to the connecting electrode 17f. The via electrode 16c is connected to the connecting electrode 17e and the via electrode 16b, which is provided on the insulating layer 11k. The via electrode 16d is connected to the connecting electrode 17f and the connecting electrode 17d, which is provided on the insulating layer 11k.

The insulating layer 11m includes a via electrode 16e that penetrates therethrough between both main surfaces thereof. A connecting electrode 17g and a line electrode 18d are provided on one main surface of the insulating layer 11m. The line electrode 18d has one end connected to the connecting electrode 17g and the other end connected to the first ground terminal 3a. The via electrode 16e is connected to the connecting electrode 17g and the via electrode 16d, which is provided on the insulating layer 11l.

The insulating layer 11n includes a via electrode 16f that penetrates therethrough between both main surfaces thereof. A connecting electrode 17h and a line electrode 18e are provided on one main surface of the insulating layer 11n. The line electrode 18e has one end connected to the connecting electrode 17h and the other end connected to the first ground terminal 3a. The via electrode 16f is connected to the connecting electrode 17h and the via electrode 16e, which is provided on the insulating layer 11m.

The undivided inductor L2 of the LC parallel resonator Re2 at the intermediate stage of the band pass filter 600 according to the comparative example is defined by a spiral electrode that connects the via electrode 16a, the connecting electrode 17a, the line electrode 18a, the connecting electrodes 17b, the via electrode 16b, the connecting electrodes 17c and 17e connected to each other through the via electrode 16c, the line electrodes 18b and 18c in two layers, the connecting electrodes 17d and 17f connected to each other through the via electrode 16d, the via electrode 16e, the connecting electrodes 17g and 17h connected to each other through the via electrode 16f, the line electrodes 18d and 18e in two layers, and the first ground terminals 3a.

As described above, the strength of the magnetic coupling M1 and the strength of the magnetic coupling M2 are equalized in the band pass filter 100 according to the present preferred embodiment, in which the inductor at the intermediate stage is divided. Accordingly, as illustrated in FIGS. 4A and 4B, the reflection characteristic on the first input/output terminal 2a side and the reflection characteristic on the second input/output terminal 2b side are coincident with each other in the desired band. Furthermore, impedance is preferably matched between the one and the other input/output terminal sides.

In contrast, the strength of the magnetic coupling M1 and the strength of the magnetic coupling M2 are not equalized in the band pass filter 600 according to the comparative example, in which the inductor L2 at the intermediate stage is not divided. Accordingly, as illustrated in FIGS. 7A and 7B, the reflection characteristic on a first input/output terminal 2a side and the reflection characteristic on a second input/output terminal 2b side are not coincident with each other in the desired band. Furthermore, impedance is not matched between the one and the other input/output terminal sides.

Second Preferred Embodiment

Figure 8:
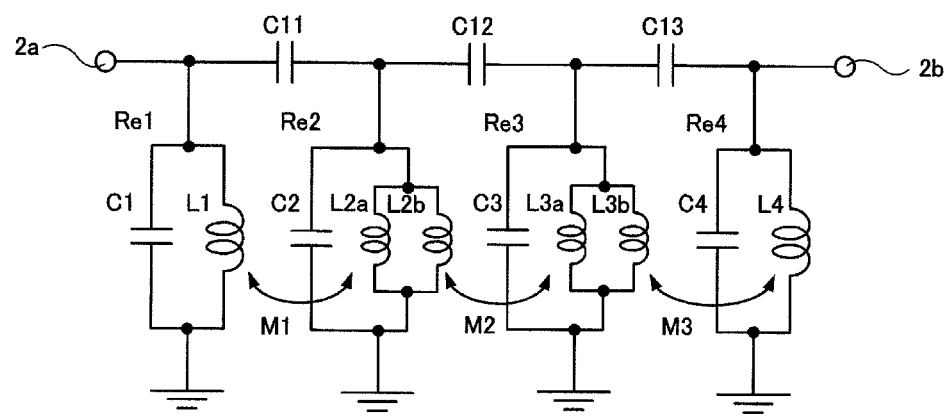
FIG. 8 is an equivalent circuit diagram of a band pass filter 200 according to a second preferred embodiment of the present invention.

FIG. 8 is a band pass filter 200 according to a second preferred embodiment of the present invention. FIG. 8 is an equivalent circuit diagram of the band pass filter 200.

The band pass filter 200 includes a first input/output terminal 2a and a second input/output terminal 2b.

Three capacitive coupling capacitors C11, C12, and C13 are connected between the first input/output terminal 2a and the second input/output terminal 2b.

The band pass filter 200 includes an LC parallel resonator Re1 at a first input/output stage, two LC parallel resonators Re2 and Re3 at an intermediate stage, and an LC parallel resonator Re4 at a second input/output stage. The number of LC parallel resonators at the intermediate stage is larger in the band pass filter 200 than in the band pass filter 100 according to the first preferred embodiment having been described. Accordingly, the pass band is widened and attenuation is increased.

The LC parallel resonator Re1 at the first input/output stage includes an inductor L1 and a capacitor C1 connected in parallel with each other. One end of the LC parallel resonator Re1 at the first input/output stage is connected between the first input/output terminal 2a and the capacitor C11. The other end of the LC parallel resonator Re1 at the first input/output stage is connected to a ground terminal.

The first LC parallel resonator Re2 at the intermediate stage includes a first inductor L2a and a second inductor L2b, which are connected in parallel with each other, and a capacitor C2, which is connected in parallel with the first inductor L2a and the second inductor L2b. One end of the LC parallel resonator Re2 at the intermediate stage is connected to a node where the capacitor C11 and the capacitor C12 are connected to each other. The other end of the LC parallel resonator Re2 at the intermediate stage is connected to a ground terminal.

The second LC parallel resonator Re3 at the intermediate stage includes a first inductor L3a and a second inductor L3b, which are connected in parallel with each other, and a capacitor C3, which is connected in parallel with the first inductor L3a and the second inductor L3b. One end of the LC parallel resonator Re3 at the intermediate stage is connected to a node where the capacitor C12 and the capacitor C13 are connected to each other. The other end of the LC parallel resonator Re3 at the intermediate stage is connected to a ground terminal.

The LC parallel resonator Re4 at the second input/output stage includes an inductor L4 and a capacitor C4 connected in parallel with each other. One end of the LC parallel resonator Re4 at the second input/output stage is connected between the capacitor C13 and the second input/output terminal 2b. The other end of the LC parallel resonator Re4 at the second input/output stage is connected to a ground terminal.

In the band pass filter 200, the inductor L1 of the LC parallel resonator Re1 and the first inductor L2a of the LC parallel resonator Re2 are in magnetic coupling M1 with each other. Furthermore, the second inductor L2b of the LC parallel resonator Re2 and the first inductor L3a of the LC parallel resonator Re3 are in magnetic coupling M3 with each other. Furthermore, the second inductor L3b of the LC parallel resonator Re3 and the inductor L4 of the LC parallel resonator Re4 are in magnetic coupling M3 with each other. In the band pass filter 200, the inductor of the LC parallel resonator Re2 is divided into the first inductor L2a and the second inductor L2b, and the inductor of the LC parallel resonator Re3 is divided into the first inductor L3a and the second inductor L3b. Accordingly, the strengths of the magnetic coupling M1, M2, and M3 are easily adjusted.

For example, the strength of the magnetic coupling M1 and the strength of the magnetic coupling M3 are able to be easily equalized.

Furthermore, each of the strength of the magnetic coupling M1, the strength of the magnetic coupling M2, and the strength of the magnetic coupling M3 is able to be independently adjusted.

Furthermore, in the case where the band pass filter 200 includes a multilayer body such that, when the multilayer body is seen in the laminate direction, a spiral electrode of the inductor L1 and a spiral electrode of the first inductor L2a are superposed on each other, a spiral electrode of the second inductor L2b and a spiral electrode of the first inductor L3a are superposed on each other, and a spiral electrode of the second inductor L3b and a spiral electrode of the inductor L4 are superposed on each other, the strength of each of the magnetic coupling M1, the magnetic coupling M2, and the magnetic coupling M3 is increased. Alternatively, in the case where the band pass filter 200 is configured such that the spiral electrodes are not superposed on one another in at least one or all of three combinations described above, the strength of the magnetic coupling defined by the combination or the combinations in which the spiral electrodes are not superposed on one another is decreased.

Furthermore, in the case where the band pass filter 200 includes the multilayer body such that the spiral direction of the spiral electrode of the inductor L1 is coincident with the spiral direction of the spiral electrode of the first inductor L2a, the spiral direction of the spiral electrode of the second inductor L2b is coincident with the spiral direction of the spiral electrode of the first inductor L3a, and the spiral direction of the spiral electrode of the second inductor L3b is coincident with the spiral direction of the spiral electrode of the inductor L4, the strength of each of the magnetic coupling M1, the magnetic coupling M2, and the magnetic coupling M3 is increased. Alternatively, in the case where the band pass filter 200 is configured such that the spiral directions are opposite to each other in at least one or all of three combinations described above, the strength of the magnetic coupling defined by the combination or the combinations in which the spiral directions are opposite to each other is decreased.

Third Preferred Embodiment

Figure 9:
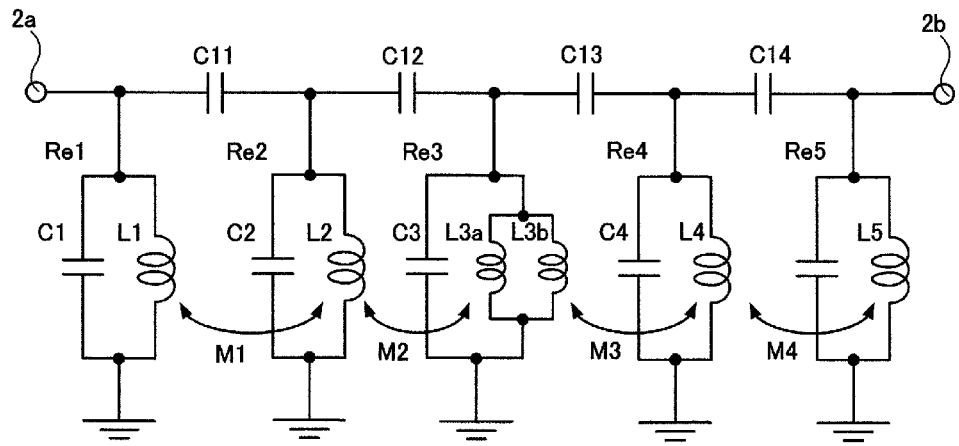
FIG. 9 is an equivalent circuit diagram of a band pass filter 300 according to a third preferred embodiment of the present invention.

FIG. 9 is a band pass filter 300 according to a third preferred embodiment of the present invention. FIG. 9 is an equivalent circuit diagram of the band pass filter 300.

The band pass filter 300 includes a first input/output terminal 2a and a second input/output terminal 2b.

Four capacitive coupling capacitors C11, C12, C13, and C14 are connected between the first input/output terminal 2a and the second input/output terminal 2b.

The band pass filter 300 includes an LC parallel resonator Re1 at a first input/output stage, three LC parallel resonators Re2, Re3, and Re4 at an intermediate stage, and an LC parallel resonator Re5 at a second input/output stage. The number of LC parallel resonators at the intermediate stage is larger in the band pass filter 200 than in the band pass filter 100 according to the first preferred embodiment and the band pass filter 200 according to the second preferred embodiment having been described. Accordingly, the pass band is widened and attenuation is increased.

The LC parallel resonator Re1 at the first input/output stage includes an inductor L1 and a capacitor C1 connected in parallel with each other. One end of the LC parallel resonator Re1 at the first input/output stage is connected between the first input/output terminal 2a and the capacitor C11. The other end of the LC parallel resonator Re1 at the first input/output is connected to a ground terminal.

The first LC parallel resonator Re2 at the intermediate stage includes an inductor L2 and a capacitor C2 connected in parallel with each other. One end of the LC parallel resonator Re2 at the intermediate stage is connected between the capacitor C11 and the capacitor C12. The other end of the LC parallel resonator Re2 at the intermediate stage is connected to a ground terminal.

The second LC parallel resonator Re3 at the intermediate stage includes a first inductor L3a and a second inductor L3b, which are connected in parallel with each other, and a capacitor C3, which is connected in parallel with the first inductor L3a and the second inductor L3b. One end of the LC parallel resonator Re3 at the intermediate stage is connected to a node where the capacitor C12 and the capacitor C13 are connected to each other. The other end of the LC parallel resonator Re3 at the intermediate stage is connected to a ground terminal.

The third LC parallel resonator Re4 at the intermediate stage includes an inductor L4 and a capacitor C4 connected in parallel with each other. One end of the LC parallel resonator Re4 at the intermediate stage is connected between the capacitor C13 and the capacitor C14. The other end of the LC parallel resonator Re4 at the intermediate stage is connected to a ground terminal.

The LC parallel resonator Re5 at the second input/output stage includes an inductor L5 and a capacitor C5 connected in parallel with each other. One end of the LC parallel resonator Re5 at the second input/output stage is connected between the capacitor C14 and the second input/output terminal 2b. The other end of the LC parallel resonator Re5 at the second input/output stage is connected to a ground terminal.

In the band pass filter 300, the inductor L1 of the LC parallel resonator Re1 and the inductor L2 of the LC parallel resonator Re2 are in magnetic coupling M1 with each other. Furthermore, the inductor L2 of the LC parallel resonator Re2 and the first inductor L3a of the LC parallel resonator Re3 are in magnetic coupling M3 with each other. Furthermore, the second inductor L3b of the LC parallel resonator Re3 and the inductor L4 of the LC parallel resonator Re4 are in magnetic coupling M3 with each other. Furthermore, the inductor L4 of the LC parallel resonator Re4 and the inductor L5 of the LC parallel resonator Re5 are in magnetic coupling M4 with each other. In the band pass filter 300, the inductor of the LC parallel resonator Re3 is divided into the first inductor L3a and the second inductor L3b. Accordingly, the strength of the magnetic coupling M2 and the strength of the magnetic coupling M3 are easily adjusted.

For example, the strength of the magnetic coupling M2 and the strength of the magnetic coupling M3 are able to be easily equalized.

Furthermore, each of the strength of the magnetic coupling M2 and the strength of the magnetic coupling M3 is able to be independently adjusted.

Furthermore, in the case where the band pass filter 300 includes a multilayer body such that, when the multilayer body is seen in the laminate direction, a spiral electrode of the inductor L2 and a spiral electrode of the first inductor L3a are superposed on each other and a spiral electrode of the second inductor L3b and a spiral electrode of the inductor L4 are superposed on each other, the strength of each of the magnetic coupling M2 and the magnetic coupling M3 is increased. Alternatively, in the case where the band pass filter 300 is configured such that the spiral electrodes are not superposed on one another in one or both of combinations described above, the strength of the magnetic coupling defined by the spiral electrodes not superposed on one another is decreased.

Furthermore, in the case where the band pass filter 300 includes the multilayer body such that the spiral direction of the spiral electrode of the inductor L2 is coincident with the spiral direction of the spiral electrode of the first inductor L3a and the spiral direction of the spiral electrode of the second inductor L3b is coincident with the spiral direction of the spiral electrode of the inductor L4, the strength of each of the magnetic coupling M2 and the magnetic coupling M3 is increased. Alternatively, in the case where the band pass filter 300 is configured such that the spiral directions are opposite to each other in one or both of combinations described above, the strength of the magnetic coupling defined by the spiral electrodes the spiral directions of which are opposite to each other is decreased.

Fourth Preferred Embodiment

Figure 10:
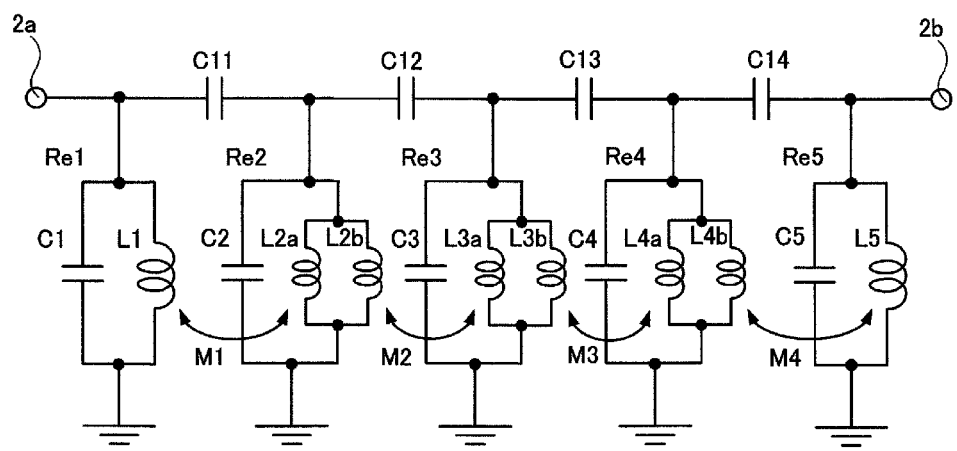
FIG. 10 is an equivalent circuit diagram of a band pass filter 400 according to a fourth preferred embodiment of the present invention.
Figure 11:
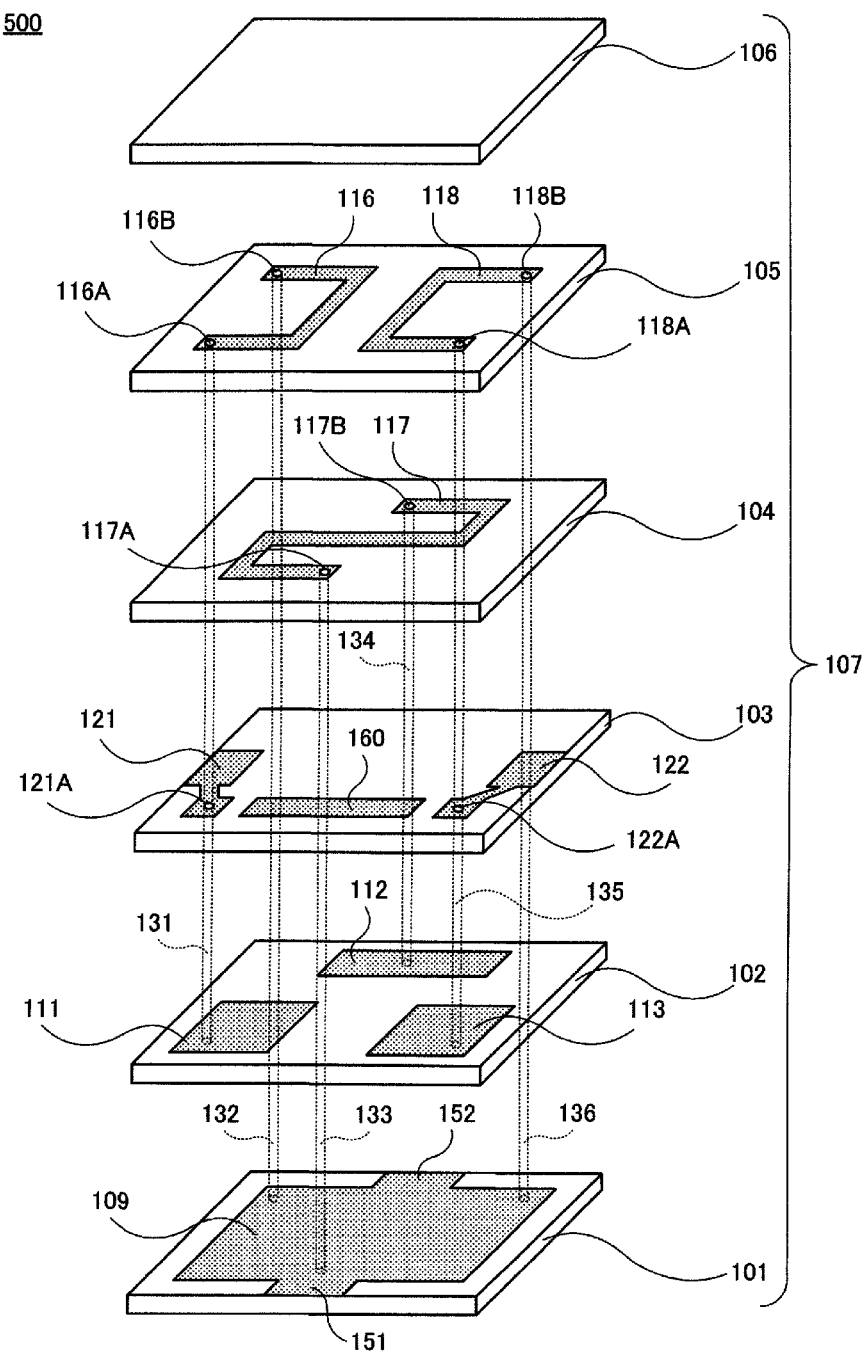
FIG. 11 is an exploded perspective view of a related-art band pass filter 500.
Figure 12:
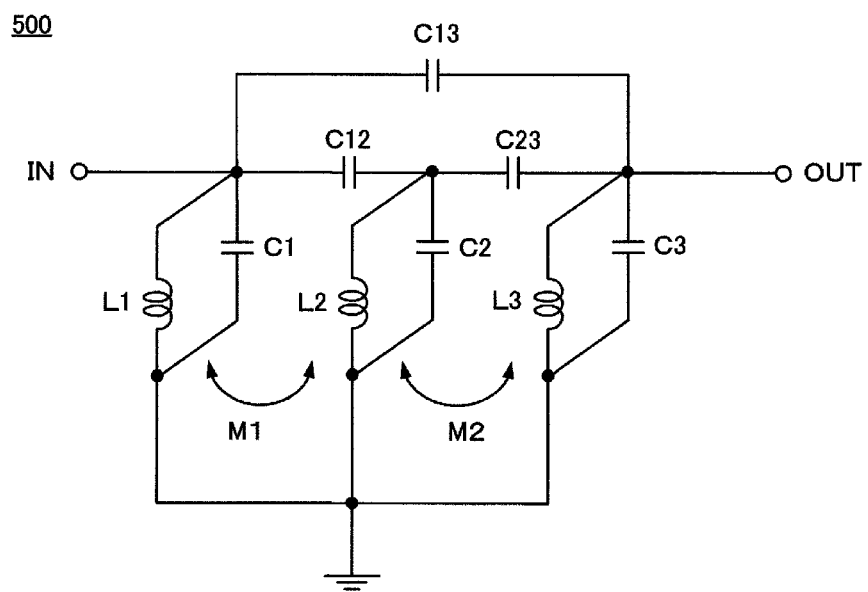
FIG. 12 is an equivalent circuit diagram of the band pass filter 500.
Figure 13:
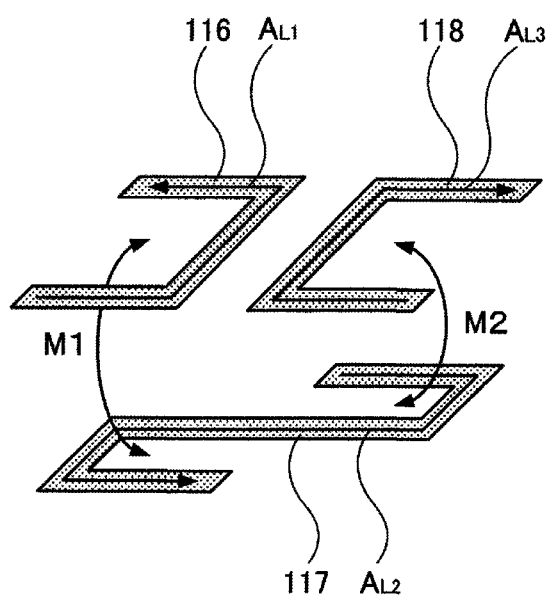
FIG. 13 is a conceptual view illustrating the positional relationships between an inductor of a first LC parallel resonator, an inductor of a second LC parallel resonator, and an inductor of a third LC parallel resonator in the band pass filter 500.

FIG. 10 is a band pass filter 400 according to a fourth preferred embodiment of the present invention. FIG. 10 is an equivalent circuit diagram of the band pass filter 400.

The band pass filter 400 includes a first input/output terminal 2a and a second input/output terminal 2b.

Four capacitive coupling capacitors C11, C12, C13, and C14 are connected between the first input/output terminal 2a and the second input/output terminal 2b.

The band pass filter 400 includes an LC parallel resonator Re1 at a first input/output stage, three LC parallel resonators Re2, Re3, and Re4 at an intermediate stage, and an LC parallel resonator Re5 at a second input/output stage. The number of LC parallel resonators at the intermediate stage is larger in the band pass filter 400 than in the band pass filter 100 according to the first preferred embodiment and the band pass filter 200 according to the second preferred embodiment having been described. Accordingly, the pass band is widened and attenuation is increased.

The LC parallel resonator Re1 at the first input/output stage includes an inductor L1 and a capacitor C1 connected in parallel with each other. One end of the LC parallel resonator Re1 at the first input/output stage is connected between the first input/output terminal 2a and the capacitor C11. The other end of the LC parallel resonator Re1 at the first input/output is connected to a ground terminal.

The LC parallel resonator Re2 which is the first LC parallel resonator at the intermediate stage includes a first inductor L2a and a second inductor L2b connected in parallel with each other and a capacitor C2 connected in parallel with the first inductor L2a and the second inductor L2b. One end of the LC parallel resonator Re2 at the intermediate stage is connected to a node where the capacitor C11 and the capacitor C12 are connected to each other. The other end of the LC parallel resonator Re2 at the intermediate stage is connected to a ground terminal.

The LC parallel resonator Re3 which is the second LC parallel resonator at the intermediate stage includes a first inductor L3a and a second inductor L3b connected in parallel with each other and a capacitor C3 connected in parallel with the first inductor L3a and the second inductor L3b. One end of the LC parallel resonator Re3 at the intermediate stage is connected to a node where the capacitor C12 and the capacitor C13 are connected to each other. The other end of the LC parallel resonator Re3 at the intermediate stage is connected to a ground terminal.

The LC parallel resonator Re4 which is the third LC parallel resonator at the intermediate stage includes a first inductor L4a and a second inductor L4b connected in parallel with each other and a capacitor C4 connected in parallel with the first inductor L4a and the second inductor L4b. One end of the LC parallel resonator Re4 at the intermediate stage is connected to a node where the capacitor C13 and the capacitor C14 are connected to each other. The other end of the LC parallel resonator Re4 at the intermediate stage is connected to a ground terminal.

The LC parallel resonator Re5 at the second input/output stage includes an inductor L5 and a capacitor C5 connected in parallel with each other. One end of the LC parallel resonator Re5 at the second input/output stage is connected between the capacitor C14 and the second input/output terminal 2b. The other end of the LC parallel resonator Re5 at the second input/output stage is connected to a ground terminal.

In the band pass filter 400, the inductor L1 of the LC parallel resonator Re1 and the first inductor L2a of the LC parallel resonator Re2 are in magnetic coupling M1 with each other. Furthermore, the second inductor L2b of the LC parallel resonator Re2 and the first inductor L3a of the LC parallel resonator Re3 are in magnetic coupling M3 with each other. Furthermore, the second inductor L3b of the LC parallel resonator Re3 and the first inductor L4a of the LC parallel resonator Re4 are in magnetic coupling M3 with each other. Furthermore, the second inductor L4b of the LC parallel resonator Re4 and the inductor L5 of the LC parallel resonator Re5 are in magnetic coupling M4 with each other. In the band pass filter 400, the inductor of the LC parallel resonator Re2 is divided into the first inductor L2a and the second inductor L2b, the inductor of the LC parallel resonator Re3 is divided into the first inductor L3a and the second inductor L3b, and the inductor of the LC parallel resonator Re4 is divided into the first inductor L4a and the second inductor L4b. Accordingly, the strengths of the magnetic coupling M1, the magnetic coupling M2, the magnetic coupling M3, and the magnetic coupling M4 are easily adjusted.

For example, the strength of the magnetic coupling M2 and the strength of the magnetic coupling M3 are able to be easily equalized. Likewise, the strength of the magnetic coupling M1 and the strength of the magnetic coupling M4 are able to be easily equalized.

Furthermore, the strength of each of the magnetic coupling M1, the magnetic coupling M2, the magnetic coupling M3 and the magnetic coupling M4 is able to be independently adjusted.

Furthermore, in the case where the band pass filter 400 includes a multilayer body, when the multilayer body is seen in the laminate direction, such that a spiral electrode of the inductor L1 and a spiral electrode of the first inductor L2a are superposed on each other, a spiral electrode of the second inductor L2b and a spiral electrode of the first inductor L3a are superposed on each other, a spiral electrode of the second inductor L3b and a spiral electrode of the first inductor L4a are superposed on each other, and a spiral electrode of the second inductor L4b and a spiral electrode of the inductor L5 are superposed on each other, the strength of each of the magnetic coupling M1, the magnetic coupling M2, the magnetic coupling M3, and the magnetic coupling M4 is increased. Alternatively, in the case where the band pass filter 400 is configured such that the spiral electrodes are not superposed on one another in at least one or all of four combinations described above, the strength of the magnetic coupling defined by the combination or the combinations in which the spiral electrodes are not superposed on one another is decreased.

Furthermore, in the case where the band pass filter 400 includes the multilayer body such that the spiral direction of the spiral electrode of the inductor L1 is coincident with the spiral direction of the spiral electrode of the first inductor L2a, the spiral direction of the spiral electrode of the second inductor L2b is coincident with the spiral direction of the spiral electrode of the first inductor L3a, the spiral direction of the spiral electrode of the second inductor L3b is coincident with the spiral direction of the spiral electrode of the first inductor L4a, and the spiral direction of the spiral electrode of the second inductor L4b is coincident with the spiral direction of the spiral electrode of the inductor L5, the strength of each of the magnetic coupling M1, the magnetic coupling M2, the magnetic coupling M3, and the magnetic coupling M4 is increased. Alternatively, in the case where the band pass filter 400 is configured such that the spiral directions are opposite to each other in at least one or all of three combinations described above, the strength of the magnetic coupling defined by the combination or the combinations in which the spiral directions are opposite to each other is decreased.

The band pass filters according to the first to fourth preferred embodiments have been described. However, the present invention is not limited to the above description, and various changes can be made without departing from the gist of the present invention.

For example, the number of LC parallel resonators included in the band pass filter is arbitrarily determined and is not limited to the above-described numbers.

Furthermore, electronic components such as an inductor, capacitor, and so forth other than the electronic components having been described may be added to the equivalent circuits of the band pass filters.

Furthermore, although the band pass filters may include the multilayer body made of ceramic or the like in the above description, it is not required to use the multilayer bodies according to preferred embodiments of the present invention. For example, a band pass filter according to a preferred embodiment of the present invention may be configured by mounting capacitors and inductors on a board.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A band pass filter comprising:
   a first input/output terminal;
   a second input/output terminal;
   a ground terminal; and
   a plurality of LC parallel resonators; wherein
   an inductor and a capacitor are connected in parallel with each other in each of the plurality of LC parallel resonators;
   the plurality of LC parallel resonators include:
      an LC parallel resonator at a first input/output stage;
      at least one LC parallel resonator at an intermediate stage; and
      an LC parallel resonator at a second input/output stage; wherein
   one end of the LC parallel resonator at the first input/output stage, one end of the at least one LC parallel resonator at the intermediate stage, and one end of the LC parallel resonator at the second input/output stage are sequentially connected between the first input/output terminal and the second input/output terminal;
   another end of the LC parallel resonator at the first input/output stage, another end of the at least one LC parallel resonator at the intermediate stage, and another end of the LC parallel resonator at the second input/output stage are connected to the ground terminal;
   the inductors of adjacent LC parallel resonators of the plurality of LC parallel resonators are magnetically coupled to one another;
   the inductor of the at least one LC parallel resonator at the intermediate stage is divided into a first inductor and a second inductor connected in parallel with each other; and
   the first inductor is magnetically coupled to the inductor of one of the adjacent LC parallel resonators, and the second inductor is magnetically coupled to the inductor of another of the adjacent LC parallel resonators.

2. The band pass filter according to claim 1, wherein a ratio of an inductance value of the first inductor to an inductance value of the second inductor is 1:1.

3. The band pass filter according to claim 1, wherein the LC parallel resonators are provided in three units in which the at least one LC parallel resonator at the intermediate stage includes a single LC parallel resonator and the inductor of the single LC parallel resonator at the intermediate stage is divided into the first inductor and the second inductor connected in parallel with each other.

4. The band pass filter according to claim 1, wherein the LC parallel resonators are provided in four units in which the at least one LC parallel resonator at the intermediate stage includes two LC parallel resonators and the inductors of the two LC parallel resonators at the intermediate stage are each divided into the first inductor and the second inductor connected in parallel with each other.

5. The band pass filter according to claim 1, wherein the LC parallel resonators are disposed in five units in which the at least one LC parallel resonator at the intermediate stage includes three LC parallel resonators, and the inductor of one of the three LC parallel resonators disposed at a middle position of the intermediate stage is divided into the first inductor and the second inductor connected in parallel with each other.

6. The band pass filter according to claim 1, wherein
   the LC parallel resonators are disposed in five units in which the at least one LC parallel resonator at the intermediate stage includes three LC parallel resonators; and
   the inductors of the three LC parallel resonators at the intermediate stage are each divided into the first inductor and the second inductor connected in parallel with each other.

7. The band pass filter according to claim 1, wherein
   the band pass filter includes a multilayer body in which a plurality of insulating layers are laminated one on top of another in a lamination direction;
   the inductors of the LC parallel resonators are each defined by a spiral electrode that includes a line electrode between the insulating layers of the multilayer body and a via electrode that penetrates through the insulating layers of the multilayer body;
   the capacitors of the LC parallel resonators are defined by capacitor electrodes between the insulating layers of the multilayer body; and
   when the multilayer body is seen in the lamination direction, the spiral electrode of the first inductor of the at least one LC parallel resonator or at least one of the LC parallel resonators at the intermediate stage is superposed on the spiral electrode of the inductor of the one of the adjacent LC parallel resonators in an equivalent circuit, and the spiral electrode of the second inductor of the at least one LC parallel resonator or the at least one of the LC parallel resonators at the intermediate stage is superposed on the spiral electrode of the inductor of the other adjacent LC parallel resonator in the equivalent circuit.

8. The band pass filter according to claim 7, wherein a shape of the spiral electrode of the first inductor is identical to a shape of the spiral electrode of the second inductor.

9. The band pass filter according to claim 7, wherein, when the multilayer body is seen in the lamination direction:

a winding direction of the spiral electrode of the first inductor of the at least one LC parallel resonator or at least one of the LC parallel resonators at the intermediate stage is coincident with a winding direction of the spiral electrode of the inductor of the one of the adjacent LC parallel resonators in the equivalent circuit; and a winding direction of the spiral electrode of the second inductor of the at least one LC parallel resonator or the at least one of the LC parallel resonators at the intermediate stage is coincident with a winding direction of the spiral electrode of the inductor of the other adjacent LC parallel resonator in the equivalent circuit.

10. The band pass filter according to claim 7, wherein, when the multilayer body is seen in the lamination direction:

a winding direction of the spiral electrode of the first inductor of the at least one LC parallel resonator or at least one of the LC parallel resonators at the intermediate stage is opposite to a winding direction of the spiral electrode of the inductor of the one of the adjacent LC parallel resonators in the equivalent circuit; and a winding direction of the spiral electrode of the second inductor of the at least one LC parallel resonator or the at least one of the LC parallel resonators at the intermediate stage is opposite to a winding direction of the spiral electrode of the inductor of the other adjacent LC parallel resonator in the equivalent circuit.

11. The band pass filter according to claim 7, wherein, when the multilayer body is seen in the lamination direction:

a winding direction of the spiral electrode of the first inductor of the at least one LC parallel resonator or at least one of the LC parallel resonators at the intermediate stage is coincident with a winding direction of the spiral electrode of the inductor of the one of the adjacent LC parallel resonators in the equivalent circuit, and a winding direction of the spiral electrode of the second inductor of the at least one LC parallel resonator or the at least one of the LC parallel resonators at the intermediate stage is opposite to a winding direction of the spiral electrode of the inductor of the other adjacent LC parallel resonator in the equivalent circuit; or the winding direction of the spiral electrode of the first inductor of the at least one LC parallel resonator or the at least one of the LC parallel resonators at the intermediate stage is opposite to the winding direction of the spiral electrode of the inductor of the one of the adjacent LC parallel resonators in the equivalent circuit, and the winding direction of the spiral electrode of the second inductor of the at least one LC parallel resonator or the at least one of the LC parallel resonators at the intermediate stage is coincident with the winding direction of the spiral electrode of the inductor of the other adjacent LC parallel resonator in the equivalent circuit.

12. The band pass filter according to claim 7, wherein the multilayer body has a rectangular or substantially rectangular shape.

13. The band pass filter according to claim 1, wherein a strength of magnetic coupling of the first inductor to the inductor of the one of the adjacent LC parallel resonators is equal or substantially equal to a strength of the magnetic coupling of the second inductor to the inductor of the another of the adjacent LC parallel resonators.

14. The band pass filter according to claim 1, wherein a plurality of capacitive coupling capacitors are connected between the first input/output terminal and the second input/output terminal.

15. The band pass filter according to claim 1, wherein the at least one LC parallel resonator at an intermediate stage includes two LC parallel resonators.

16. The band pass filter according to claim 1, wherein the at least one LC parallel resonator at an intermediate stage includes three LC parallel resonators.

* * * * *